United States Patent
Furuhashi et al.

(10) Patent No.: US 6,208,064 B1
(45) Date of Patent: Mar. 27, 2001

(54) PIEZOELECTRIC TRANSFORMER DRIVE CIRCUIT AND DRIVE METHOD

(75) Inventors: Naoki Furuhashi; Katuyuki Fujikura, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/361,227

(22) Filed: Jul. 27, 1999

(30) Foreign Application Priority Data

Jul. 29, 1998 (JP) ................................................ 10-213380

(51) Int. Cl.[7] .................................................. H02M 7/538
(52) U.S. Cl. ...................................... 310/316.01; 310/318
(58) Field of Search ................................ 310/316.01, 318

(56) References Cited

U.S. PATENT DOCUMENTS

| | | | | |
|---|---|---|---|---|
| 3,598,909 | * | 8/1971 | Sasaki et al. ........................ | 310/318 |
| 3,657,579 | * | 4/1972 | Kramer ................................ | 310/318 |
| 5,731,652 | * | 3/1998 | Shimada .......................... | 310/316.01 |
| 5,866,969 | * | 2/1999 | Shimada et al. ..................... | 310/318 |
| 5,923,546 | * | 7/1999 | Shimada et al. ....................... | 363/40 |
| 6,016,052 | * | 1/2000 | Vaughn ................................ | 323/355 |
| 6,087,757 | * | 7/2000 | Honbo et al. ................... | 310/316.01 |
| 6,133,672 | * | 10/2000 | Sasaki et al. ........................ | 420/318 |

FOREIGN PATENT DOCUMENTS 9-107684   4/1997   (JP) .............................. H02M/7/538

* cited by examiner

*Primary Examiner*—Thomas M. Dougherty
(74) *Attorney, Agent, or Firm*—Sughrue, Mion, Zinn, Macpeak & Seas, PLLC

(57) ABSTRACT

A drive circuit performing time division drive of a piezoelectric transformer realizes a wide dimmer control range and prevention of blinking at a frequency visually perceptible upon lacking of output, prevention of blinking of a load at the frequency visually perceptible before initiation of turning ON of the load, and suppression of heating of parts of the drive circuit at no load operation. Time division frequency signals used in time division driving are generated in a plurality of kinds in a dimmer control circuit. The generated plurality of kinds of time division frequency signals is selected depending upon the condition of the load and a dimmer condition of the piezoelectric transformer and thus to select optimal time division drive frequency or simultaneously with a plurality of time division drive frequency, the piezoelectric transformer is driven.

22 Claims, 17 Drawing Sheets

| STATE | OUTPUT OF TIMER CIRCUIT 33 | CONDUCT SWITCH 27 OR 28 | COMPARATOR 37 OR 38 OUTPUTTING DIMMER CONTROL | OUTPUT OF INTEGRATOR CIRCUIT 26 | PRESENCE OR ABSENCE OF OUTPUT OF COMPARATOR 36 | TRIANGULAR WAVE OSCILLATION CIRCUIT TO BE DIMMER CONTROL FREQUENCY |
|---|---|---|---|---|---|---|
| STABLE TURNING ON LOAD | HIGH LEVEL | 28 | 38 | LOW LEVEL | ABSENT | 36 |
| AFTER TURNING ON POWER SUPPLY AND BEFORE TURNING ON LOAD | LOW LEVEL | 27 | 37 | LOW LEVEL | ABSENT | 34 |
| FREQUENCY SWEEPING DUE TO LACK OF OUTPUT | LOW LEVEL | 27 | 37 | LOW LEVEL | ABSENT | 34 |
| NO LOAD OPERATION | LOW LEVEL | 27 | 37 | HIGH LEVEL | PRESENT | 34 AND 42 |

FIG.2

| STATE | OUTPUT OF TIMER CIRCUIT 33 | CONDUCT SWITCH 27 OR 28 | COMPARATOR 37 OR 38 OUTPUTTING DIMMER CONTROL | OUTPUT OF INTEGRATOR CIRCUIT 26 | PRESENCE OR ABSENCE OF OUTPUT OF COMPARATOR 36 | TRIANGULAR WAVE OSCILLATION CIRCUIT TO BE DIMMER CONTROL FREQUENCY |
|---|---|---|---|---|---|---|
| STABLE TURNING ON LOAD | HIGH LEVEL | 28 | 38 | LOW LEVEL | ABSENT | 36 |
| AFTER TURNING ON POWER SUPPLY AND BEFORE TURNING ON LOAD | LOW LEVEL | 27 | 37 | LOW LEVEL | ABSENT | 34 |
| FREQUENCY SWEEPING DUE TO LACK OF OUTPUT | LOW LEVEL | 27 | 37 | LOW LEVEL | ABSENT | 34 |
| NO LOAD OPERATION | LOW LEVEL | 27 | 37 | HIGH LEVEL | PRESENT | 34 AND 42 |

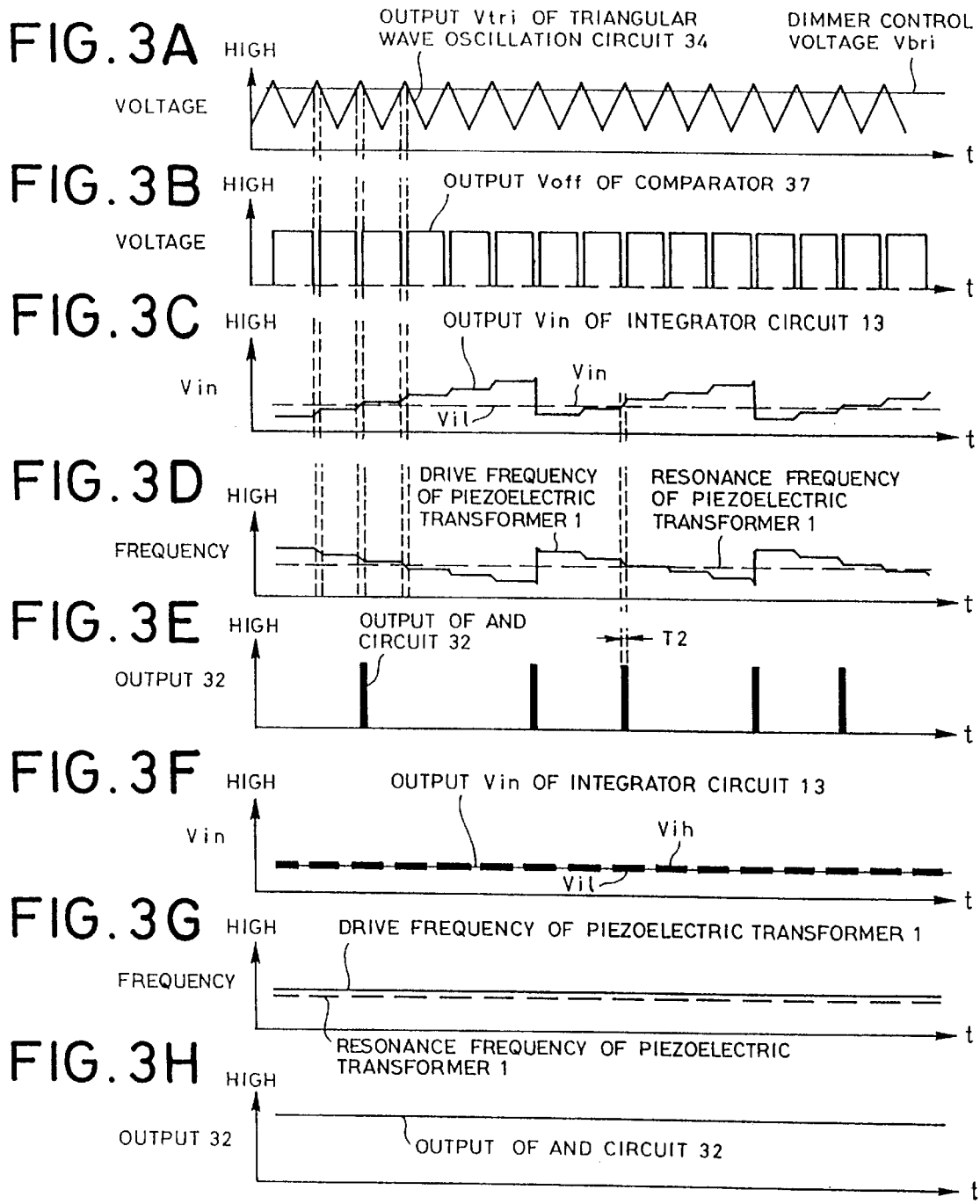

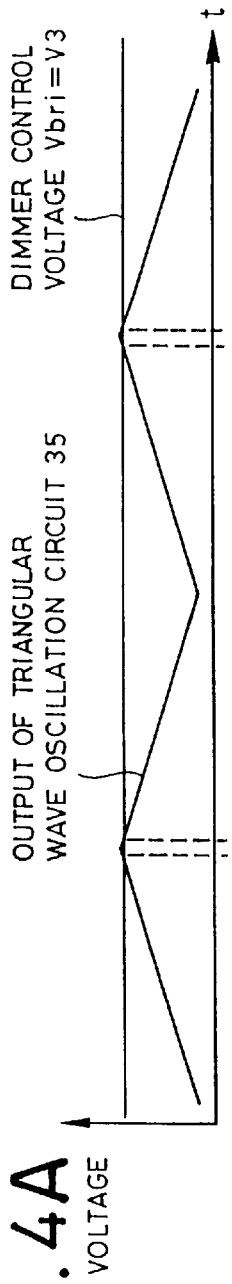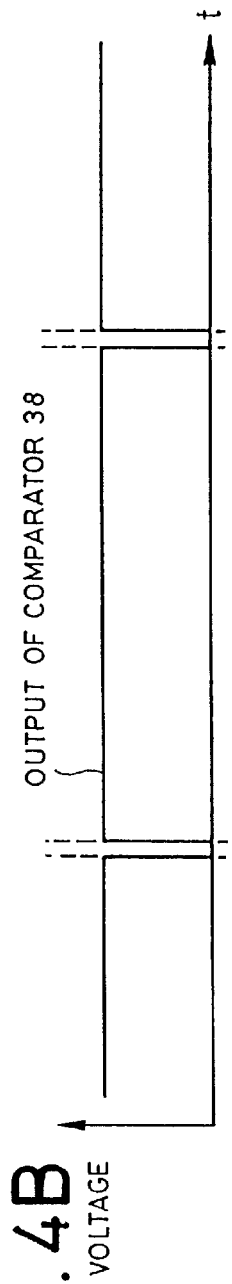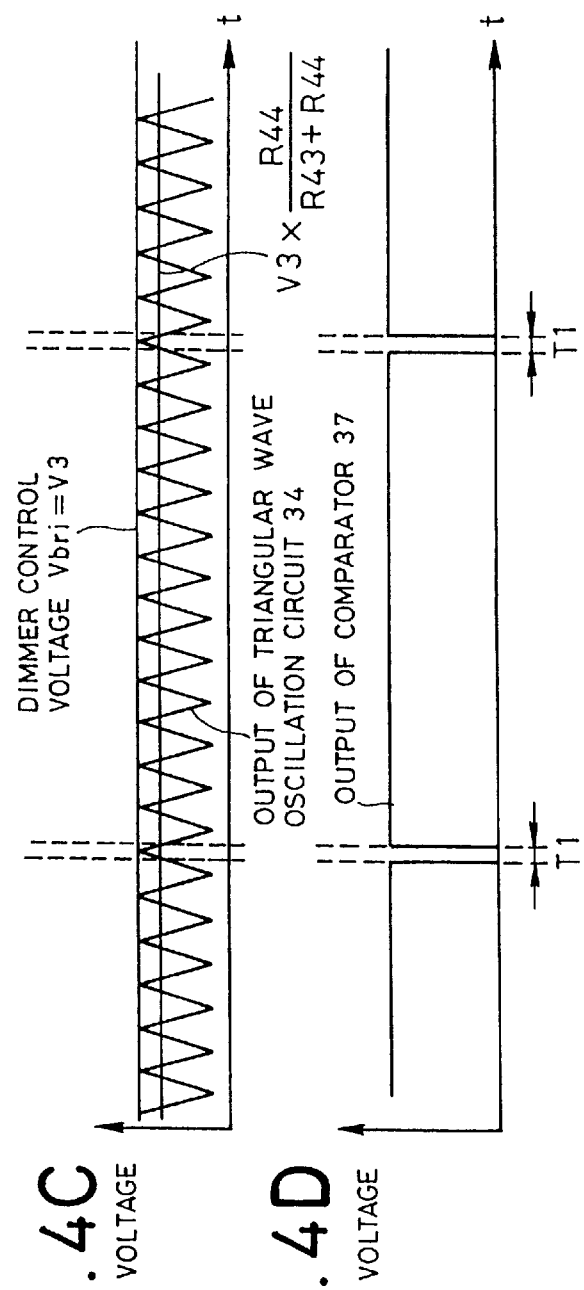

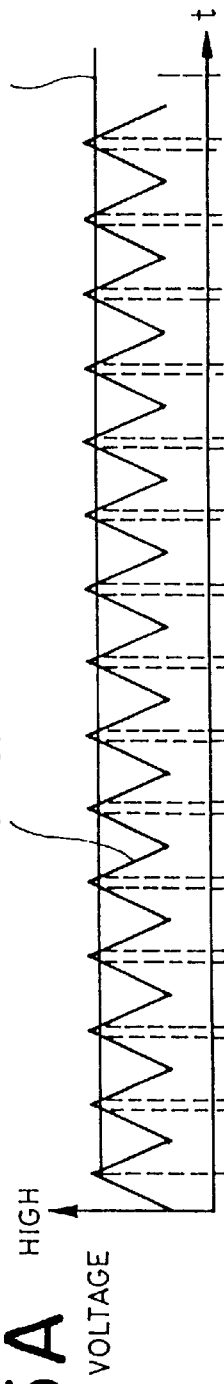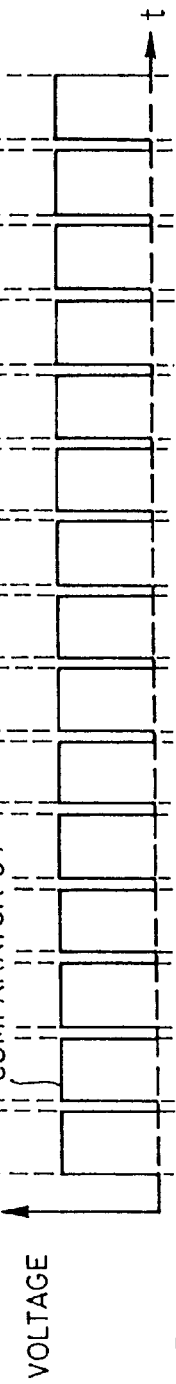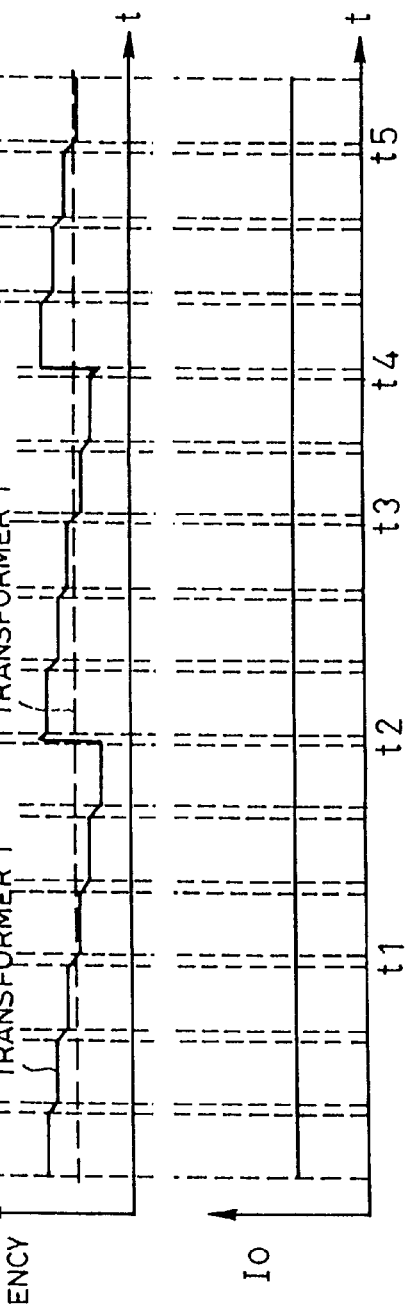
FIG.5A
FIG.5B
FIG.5C
FIG.5D

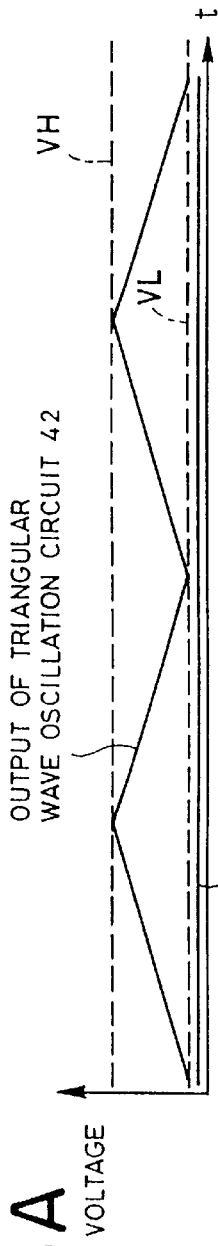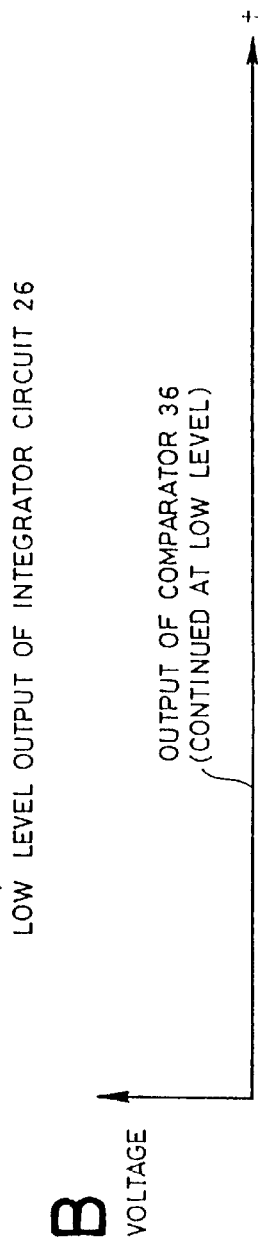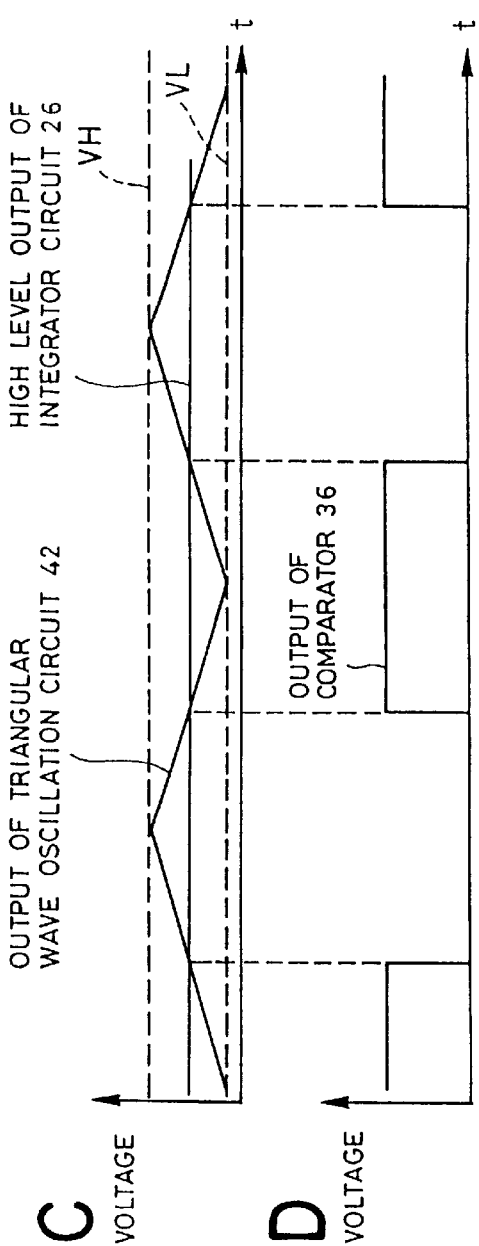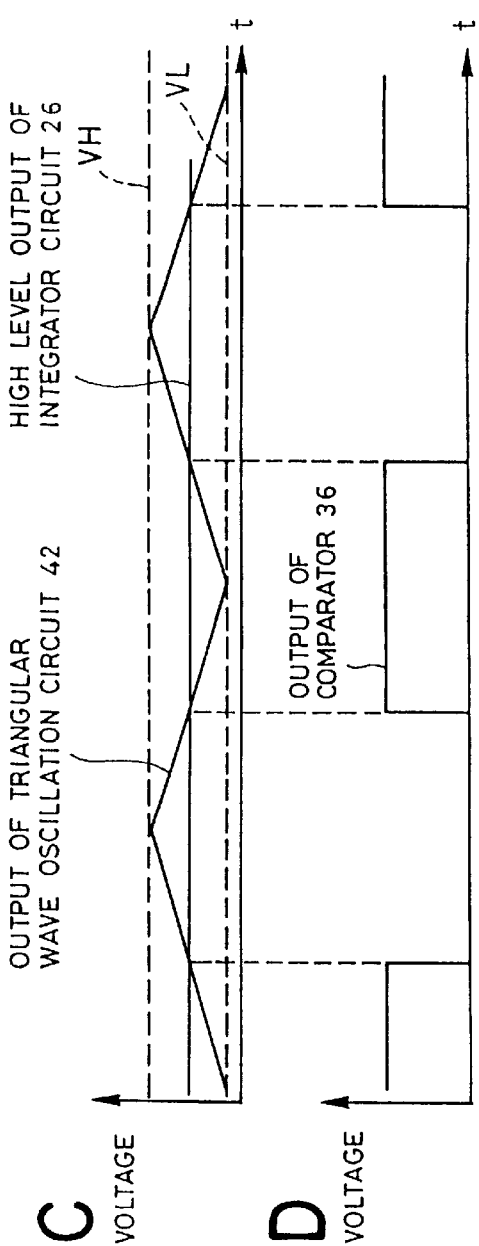

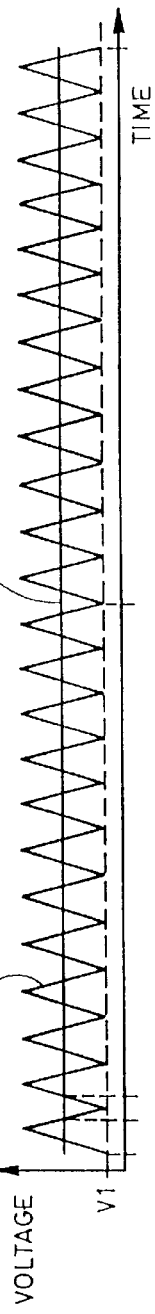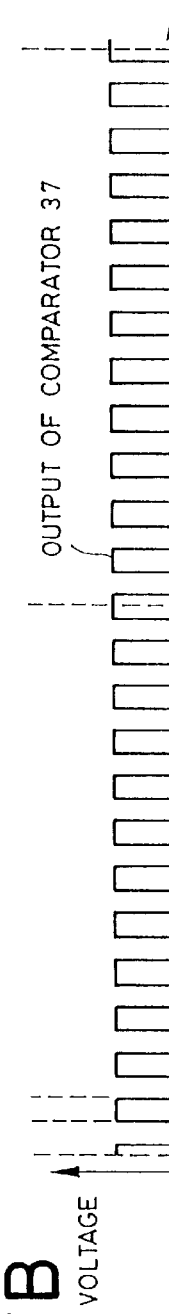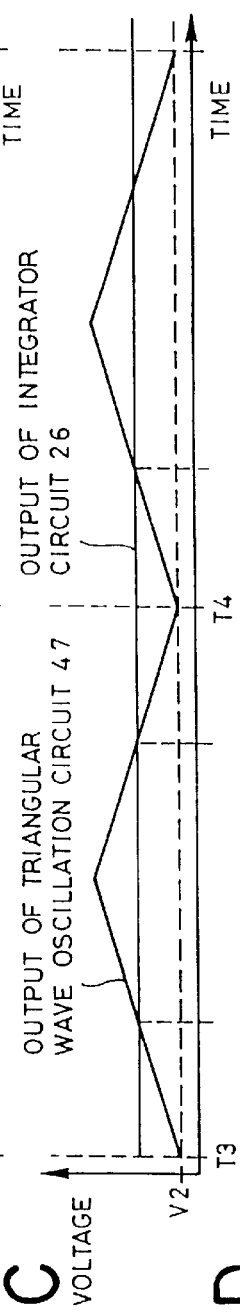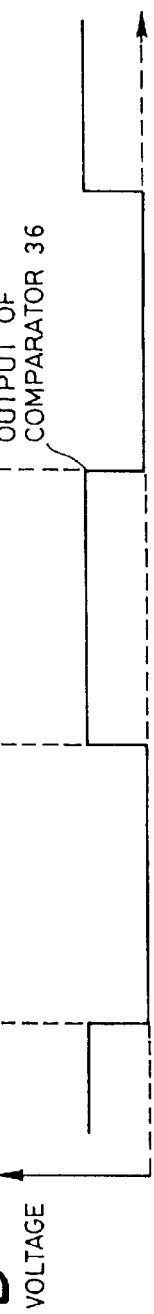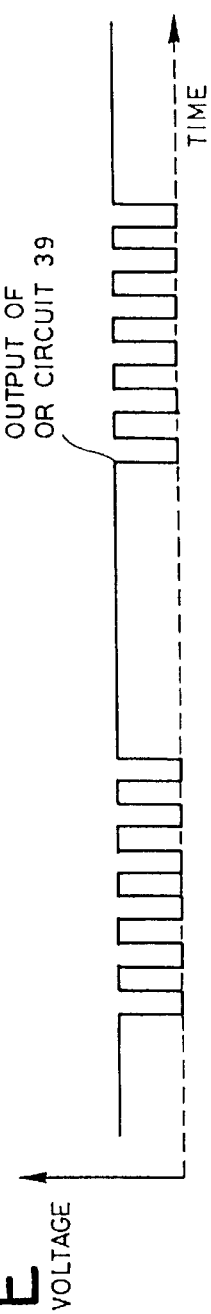

FIG.10

| STATE | DIMMER CONTROL VOLTAGE | OUTPUT OF COMPARATOR 45 | OUTPUT OF TIMER CIRCUIT 33 | OUTPUT OF AND CIRCUIT 46 | CONDUCT SWITCH 27 OR 28 | COMPARATOR 37 OR 38 OUTPUTTING UPON DIMMER CONTROL | OUTPUT OF INTEGRATOR CIRCUIT 26 | PRESENCE OR ABSENCE OF OUTPUT OF COMPARATOR 36 | TRIANGULAR WAVE OSCILLATION CIRCUIT TO BE DIMMER CONTROL FREQUENCY |
|---|---|---|---|---|---|---|---|---|---|
| UPON TURNING LOAD ON | <Vs (LARGE DUTY RATIO) | LOW LEVEL | HIGH LEVEL | LOW LEVEL | 27 | 37 | LOW LEVEL | ABSENT | 34 |
|  | >Vs (SMALL DUTY RATIO) | HIGH LEVEL | HIGH LEVEL | HIGH LEVEL | 28 | 38 | LOW LEVEL | ABSENT | 35 |
| AFTER TURNING ON POWER SUPPLY AND BEFORE TURNING LOAD ON | <Vs (LARGE DUTY RATIO) | LOW LEVEL | LOW LEVEL | LOW LEVEL | 27 | 37 | LOW LEVEL | ABSENT | 34 |
|  | >Vs (SMALL DUTY RATIO) | HIGH LEVEL | LOW LEVEL | LOW LEVEL | 27 | 37 | LOW LEVEL | ABSENT | 34 |
| UPON FREQUENCY SWEEPING DUE TO LACK OF OUTPUT | <Vs (LARGE DUTY RATIO) | LOW LEVEL | LOW LEVEL | LOW LEVEL | 27 | 37 | LOW LEVEL | ABSENT | 34 |
|  | >Vs (SMALL DUTY RATIO) | HIGH LEVEL | LOW LEVEL | LOW LEVEL | 27 | 37 | LOW LEVEL | ABSENT | 34 |
| UPON NO LOAD OPERATION | <Vs (LARGE DUTY RATIO) | LOW LEVEL | LOW LEVEL | LOW LEVEL | 27 | 37 | HIGH LEVEL | PRESENT | 34 AND 42 |
|  | >Vs (SMALL DUTY RATIO) | HIGH LEVEL | LOW LEVEL | LOW LEVEL | 27 | 37 | HIGH LEVEL | PRESENT | 34 AND 42 |

PIEZOELECTRIC TRANSFORMER DRIVE CIRCUIT AND DRIVE METHOD

BACKGROUND OF THE INVENTION

1. Field of the Invention

The present invention relates generally to a piezoelectric transformer circuit drive circuit and a piezoelectric transformer driving method. More particularly, the invention relates to a piezoelectric transformer circuit drive circuit and a piezoelectric transformer driving method taking a power source for a back-light of a display device employing a liquid crystal, as a load, or so forth.

2. Description of the Related Art

In general, a piezoelectric transformer is an element, in which primary side and secondary side electrodes are attached on a piezoelectric material to cause resonance of a transformer by applying a voltage of resonance frequency of the piezoelectric transformer on the primary side and to lead out a voltage generated by mechanical resonation on the secondary side. The piezoelectric transformer is characterized in capability of down-sizing and reduction of thickness in comparison with an electromagnetic transformer. Therefore, the piezoelectric transformer is an element attracting attention as a back-light power source for the display device employing a liquid crystal, or so forth.

The conventional drive circuit for a piezoelectric element of this type has been disclosed in Japanese Unexamined Patent Publication No. Heisei 9-107684. The disclosed drive circuit turns OFF a transistor in time division manner for interrupting an input voltage of the piezoelectric transformer for variably controlling a root-mean-square effective value of an alternating current or an alternating voltage to be supplied to the load which is connected to the piezoelectric transformer. The conventional drive circuit disclosed in the above-identified publication will be discussed with reference to FIG. 11.

As shown in FIG. 11, the conventional drive circuit includes a transformer circuit 4 having a piezoelectric transformer 1, in which a primary electrode 100 and a secondary electrode 200 are provided, a drive voltage control circuit 5 controlling a drive voltage for transforming, a frequency control circuit 3 for controlling a drive frequency, a dimmer circuit 6 for dimming when a load to be driven is a cold cathode tube.

In FIG. 11, the transformer circuit 4 drives the piezoelectric transformer 1 by resonating inductance and input capacitance of coils L1 and L2 of the piezoelectric transformer 1 and whereby generating a sine wave. Transistors Q1 and Q2 are alternately turned into ON state by clocks Vg1 and Vg2 of opposite phases output from a frequency divider circuit 8 to charge a current from a direct current power source VDD to the coils L1 and L2 as electromagnetic energy so that a voltage higher than the power source voltage can be generated as a voltage energy by discharging the charged energy upon turning OFF of the transistors Q1 and Q2. A half-wave sine wave of mutually different phase equivalently act as sine weave to vibrate the piezoelectric transformer 1 to output an elevated alternating current voltage V0 determined depending upon a shape of the piezoelectric transformer 1 from the secondary electrode 200.

The alternating current voltage V0 is applied to the load 2. Then, an alternating current IO is input to the frequency control circuit 3. The frequency control circuit 3 is a circuit performing a process for outputting a frequency data driving the piezoelectric transformer 1 to the frequency divider circuit 8 to continue sweeping of drive frequency until the alternating current IO fed back from the load reaches a predetermined value and for stopping the frequency, at which the predetermined value is obtained.

The frequency control circuit 3 is constructed with a current-voltage converting circuit 10, a rectifier circuit 11, a comparator 12, an integrator circuit 13, a comparator 14 and a voltage controlled oscillator (VCO) 15. The alternating current IO is converted into a voltage signal by the current-voltage converting circuit 10, rectified by the rectifier circuit 11 and then input to the comparator 12 as a detection signal. The comparator 12 compares the voltage of the detection signal with a reference voltage Vref. If the voltage of the detection signal is lower than the reference voltage Vref, a high level signal is output to the integration circuit 13. The integrator circuit 13 is designed to lower an output voltage at a given rate during a period where the high level signal is input. The output voltage Vin of the integrator circuit 13 is input to the VCO 15. From the VCO 15, a triangular wave fVCO and a rectangular wave fCLK are output. The output waveforms of the VCO 15 are illustrated in FIG. 12A(A). When a voltage Vin from the integrator circuit 13 is a minimum voltage value, 12A(A) illustrates the output voltage waveform as the triangular wave fVCO and 12A(B) illustrates the output voltage waveform as the rectangular wave fCLK. FIG. 12A(C) is a voltage waveform chart, in which the rectangular wave fCLK is processed by frequency division by the frequency divider circuit 8 of the transformer circuit 4 to be Vg1. While not illustrated, a signal Vg2 having opposite phase to the signal Vg1 is also generated by the frequency divider circuit 8. The frequency divider circuit 8 of the type, in which phases of the signal is reversed at the rising timing of fCLK, is premised. On the other hand, both of the triangular wave fVCO and the rectangular wave fCLK are set the frequencies thereof at a value double of the frequency for driving the piezoelectric transformer 1. FIGS. 12B(D), 12B(E) and 12B(F) respectively show fVCO. fCLK and Vg1 in the case where the voltage Vin from the integrator circuit 13 is maximum, which fVCO, fCLK and Vg1 are set for outputting higher frequency than those at the minimum voltage of Vin.

The reason why the output of the integrator circuit 13 is risen at a given rate to lower the output frequency of the VCO 15 in a period where the output of the comparator 12 is held high level, is to sweep the drive frequency from the high frequency side. The reason why sweeping the drive frequency from the high frequency side is to use the frequency region higher than the resonance frequency fr of the piezoelectric transformer 1. Thus, the step-up ratio of the piezoelectric transformer 1 is increased to increase of magnitude of the alternating current Io in time. At this condition, if the voltage input to the comparator 12 exceeds the reference voltage Vref, the output of the comparator 12 becomes low level to cause termination of the integrating operation of the integrator circuit 13. Thereafter, the output of the integrator circuit 13 is maintained at the immediately preceding voltage value. Accordingly, the frequency data output by the VCO 15 also becomes constant to drive the piezoelectric transformer at as constant drive frequency. Thus, the output of the piezoelectric transformer 1 is maintained constant.

When a direct current input voltage VDD less than a rated voltage is input to a piezoelectric transformer inverter or when a relatively long period is required to turn ON the cold cathode tube used in the load 2, the predetermined alternating current Io cannot be supplied to the frequency control circuit 3 while the direct current is supplied to lower the output frequency of the VCO 15 to be lower than or equal to the resonance frequency. Therefore, when the direct current input voltage is elevated to be higher than or equal to the rated voltage or when the cold cathode tube of the load 2 is turned ON, the step-up ratio of the piezoelectric transformer becomes insufficient to continue a condition where the predetermined output cannot be supplied to the load 2. Accordingly, when the drive frequency is lowered down to the minimum frequency of the VCO 15, it becomes necessary to return the drive frequency to the maximum frequency of the VCO 15. In this operation, when the output voltage of the integrator circuit 13 becomes lower than or equal to the reference voltage Vmin set at a value corresponding to the minimum frequency of the VCO 15, the output of the comparator 14 becomes high level to output a reset signal to the integrator circuit 13. In response to this reset signal, the output of the integrator circuit 13 becomes the maximum voltage to resume lowering of the frequency. Relationship between the transforming ratio of the piezoelectric transformer and the frequency sweeping direction are illustrated in FIG. 13. In FIG. 13, f1 is the maximum frequency and f2 is the minimum frequency. The foregoing operation is repeated until the predetermined alternating current Io is obtained as shown by arrow Y.

The drive voltage control circuit 5 is constructed with a comparator 16, a rectifier 17, a diode 18 and a transistor Q3 to control the peak current value to be supplied to the coils L1 and L2 of the transformer circuit 4 constant relative to fluctuation of the direct current input voltage and whereby to control the drive voltage of the piezoelectric transformer 1 at a predetermined value.

The rectifier circuit 17 is a circuit for rectifying the primary voltage waveform of the piezoelectric transformer 1 and then to convert into the voltage Vc. The rectified voltage Vc after conversion is input to the comparator 16. The triangular wave fVCO generated by the VCO 15 and having the frequency double of the piezoelectric transformer drive frequency is input to the comparator 16 of the drive voltage control circuit 5 to be compared with the rectified voltage Vc to apply a high level signal to a gate of the transistor Q3 during a period where the rectified voltage Vc is higher than the triangular wave fVCO.

Among timing charts shown in FIGS. 14(A) to 14(H), FIG. 14(A) shows the triangular wave fVCO and the rectified voltage Vc, FIG. 14(B) shows a gate voltage Vg3 of the transistor Q3, FIGS. 14(C) and 14(D) show gate voltages Vg1 and Vg2 of the transistors Q1 and Q2, FIGS. 14(E) and 14(F) are drain voltages Vd1 and Vd2 of the transistors Q1 and Q2, and FIGS. 14(G) and 14(H) show coil currents iL1 and iL2.

When the direct current input voltage VDD is elevated from this condition, the rectified voltage Vc is instantly increased to expand the period where Vg3 is held OFF to shorten a period for charging iL1 and iL2. By this, Vd1, Vd2, iL1 and iL2 are reduced to be controlled by the original values of the Vd1, Vd2, iL1 and iL2. Namely, even when the input voltage VDD is varied, the rectified voltage Vc relative to the triangular wave fVCO is varied significantly to cause variation of the duty ratio of the transistor Q3 to control the peak current to be charged to the coil constant and whereby to control the drive voltage of the piezoelectric transformer 1 at a predetermined value.

On the other hand, the dimmer circuit 6 is a circuit required in the case where dimmer control is necessary, such as back light using the cold cathode tube in the load. The dimmer circuit 6 is constructed with a triangular wave oscillation circuit 19 for oscillation at a frequency sufficiently lower than the drive frequency of the piezoelectric transformer 1 and a comparator 20. By externally inputting a dimmer control voltage Vbri, it is compared with an output waveform Vtri of the triangular wave oscillation circuit 19 in the comparator 20 to output a pulse signal Voff of variable duty ratio. This is shown in timing charts in FIGS. 15(A) and 15(B). The pulse signal Voff is fed to the frequency control circuit 3 and the drive voltage control circuit 5 to turn OFF the transistor Q3 in a period at high level thereof to interrupt the drive voltage for the piezoelectric transformer 1, and in conjunction therewith to hold the output voltage of the integrator circuit 13 so as not to vary the frequency of the VCO 15.

However, the foregoing prior arts encounter the following problems.

The first problem is significant limitation of a dimming range due to delay of output relative to the piezoelectric transformer 1.

Within the dimmer circuit 6, when the dimmer control voltage Vbri falls within an amplitude of the output Vtri of the triangular wave oscillation circuit 19 as shown in FIG. 15(A), the output Voff of the comparator is repeatedly turned between low level and high level as shown in FIGS. 15(B) and 15(C). During the period, in which the output Voff of the comparator 20 is held low level, the transistor Q3 becomes ON state. Therefore, as shown in FIG. 15(D), the sine wave is equivalently input to the piezoelectric transformer 1. However, as shown in FIG. 15(E), the output of the piezoelectric transformer 1 does not reach the predetermined output value until a period T1 being elapsed from initiation of input. Thus, the delay is caused in a period until reaching the predetermined output value is caused by mechanical vibration transmission speed within the piezoelectric transformer 1 and a feedback period of the drive frequency control.

Accordingly, when a continuing period of one ON period is set to be less than T1, the output of the piezoelectric transformer enters into the next OFF period before steady state is established to make illumination of the cold cathode tube unstable. Therefore, brightness of the cold cathode tube becomes unstable. By this, in a system varying brightness by varying the drive duty ratio, as shown in FIG. 16(A), the frequency of the triangular wave oscillation circuit 19 is set at a frequency F1, at which blinking may not be visually perceptible and below which blinking may be visually perceptible. The case where the drive ON period in one cycle is set at T1, the brightness becomes minimum. On the other hand, In this case, the output of the comparator 20 becomes as shown in FIG. 16(B), the drive frequency of the piezoelectric transformer 1 is FIG. 16(C), and the alternating current Io is shown in FIG. 16(D), respectively.

The minimum brightness concerns upon driving by the direct current input voltage VDD at the rated input voltage. Upon driving at the frequency F1 and at ON period T1, if the input voltage to the piezoelectric transformer inverter becomes less than the rated value, significant drawback should be encountered. Even by driving with the output of the triangular wave oscillation circuit 19 and the output of the comparator 20 as shown in FIGS. 17(A) and 17(B) under the same condition as shown in FIGS. 16(A) and 16(B), when the input voltage is less than the rated value, or when the input voltage to the piezoelectric transformer 1 is less than the rated value, since the input voltage to the piezoelectric transformer 1 does not satisfy the value for outputting the predetermined voltage and the current, frequency sweeping is repeated in the direction illustrated in FIG. 13.

However, in the case, since the frequency sweeping is interrupted during a drive OFF period for dimming, operation shown in FIG. 17(C) is performed. Since voltage input to the piezoelectric transformer 1 lacks, the alternating current Io flows slightly only when the drive frequency varies across the range close to the resonance frequency to cause phenomenon slightly illuminating the load 2 as shown in FIG. 17(D). At this time, blinking frequency is lower than F1, blinking becomes visually perceptible. The reason is that the sweeping period of the frequency control circuit 3 is expanded due to extinction period of the dimmer circuit 6 to increase a period to vary the drive frequency in f1~f2~f1 as shown in FIG. 13, and whereby to expand the period to causes light illumination to make the frequency less than the frequency F1, at which blinking is visually perceptible.

As a measure for this, there is a method to shorten a sweeping period of the drive frequency by making a time constant of the integration circuit 13 small. However, the piezoelectric transformer 1 has a property having high Q value to cause delay in response. Accordingly, there is a limit to shorten the sweeping period. Thus, the drive ON period T1 of the piezoelectric transformer 1 cannot be made sufficiently small to cause restrict dimming range.

The second problem resides in heating of parts of the drive circuit upon continuing sweeping of the frequency.

To the coils L1 and L2 shaping the input waveform to the piezoelectric transformer 1, a current shown in FIGS. 14(G) and 14(H) flows. The coil L1 is set so that the current value becomes zero immediately before the timing where the gate voltage Vg1 of the transistor Q1 becomes high level, and the coil L2 is set so that the current value becomes zero immediately before the timing where the gate voltage Vg2 of the transistor Q2 becomes high level. The setting is performed at a frequency where the alternating current Io becomes the desired value, namely, at the frequency shown by f0 in FIG. 13.

However, when the alternating current Io does not become the desired value, for example, when the load becomes open, the frequency sweeping shown in FIG. 13 is repeated. In the frequency higher than f0 within the frequency sweeping range, Vg1 and Vg2 become high level before the current flowing through the coils L1 and L2 become zero. At this moment, excessive current flows through the coils L1 and L2 and the transistors Q1 and Q2. When frequency sweeping is continued, the coils L1 and L2 and the transistors Q1 and Q2 are heated. In worst case, the coils L1 and L2 and the transistors Q1 and Q2 are heated in excess of guaranteed operation temperature, breakage of element or so forth can be caused.

SUMMARY OF THE INVENTION

The present invention has been worked out in view of the problems or drawbacks set forth above. It is therefore an object of the present invention to provide a piezoelectric transformer drive circuit and the drive method which can solve the foregoing problems simultaneously.

According to the first aspect of the present invention, a piezoelectric transformer drive circuit performing driving of a piezoelectric transformer in time division, comprises:

generating means for generating a plurality of kinds of time division frequency signals to be used in the time division driving; and selecting means for selecting a plurality of kinds of the generated time division frequency signals depending upon condition of the piezoelectric transformer, for driving the piezoelectric transformer at the time division frequency output from the selecting means.

According to the second aspect of the present invention, a piezoelectric transformer drive method for performing driving of a piezoelectric transformer in time division, comprises:

generating step of generating a plurality of kinds of time division frequency signals to be used in the time division driving; and selecting step of selecting a plurality of kinds of the generated time division frequency signals depending upon condition of the piezoelectric transformer, for driving the piezoelectric transformer at the time division frequency output from the selecting step.

The piezoelectric transformer is an element which has high output impedance, is characterized by significant dependency of operation the load impedance and leads a generated voltage on a secondary side from mechanical vibration by applying a voltage at resonance frequency on a primary side to cause resonation. Concerning a circuit for driving the piezoelectric transformer, the present invention realizes a wide dimmer control range and prevention of blinking at a frequency not visually perceptible upon lacking of output, prevention of blinking of a load at the frequency not visually perceptible before initiation of turning ON of the load, and suppression of heating of parts of the drive circuit at no load operation.

The present invention is mainly characterized by providing a plurality of time division drive frequencies, and driving the piezoelectric transformer selecting optimal time division drive frequency or simultaneously with a plurality of time division drive frequencies by detecting the load condition of the piezoelectric transformer or dimmer control condition and based on the detected values.

BRIEF DESCRIPTION OF THE DRAWINGS

The present invention will be understood more fully from the detailed description given herebelow and from the accompanying drawings of the preferred embodiment of the present invention, which, however, should not be taken to be limitative to the invention, but are for explanation and understanding only.

In the drawings:

FIG. 2 is an illustration generally showing an operation of a dimmer circuit 22 and an output voltage comparing circuit 21 in FIG. 1;

FIG. 3(A) is a timing chart showing an output waveform of a triangular wave oscillation circuit 34 in FIG. 1;

FIG. 3(B) is a timing chart showing an output waveform of a comparator 37 in FIG. 1;

FIG. 3(C) is a timing chart showing an output waveform of an integration circuit 13 in FIG. 1;

FIG. 3(D) is a timing chart showing a drive frequency of a piezoelectric transformer 1 in FIG. 1;

FIG. 3(E) is a timing chart showing an output waveform of an AND circuit 32 in FIG. 1;

FIG. 3(F) is a timing chart showing an output of the integration circuit 13 when an alternating current Io is stable at a desired value;

FIG. 3(G) is a timing chart showing a drive frequency of the piezoelectric transformer when the alternating current Io is stable at the desired value;

FIG. 3(H) is a timing chart showing an output waveform of the AND circuit 32 when the alternating current Io is stable at the desired value;

FIG. 4(A) is a timing chart showing an output waveform of a triangular wave oscillation circuit 34 in FIG. 1;

FIG. 4(B) is a timing chart showing an output waveform of a comparator 38 in FIG. 1;

FIG. 4(C) is a timing chart showing an output waveform of the triangular wave oscillation circuit 34 at a maximum value of a dimmer control voltage;

FIG. 4(D) is a timing chart showing an output waveform of a comparator 37 in FIG. 1;

FIG. 5(A) is a timing chart showing an output waveform of the triangular wave oscillation circuit 34 in FIG. 1;

FIG. 5(B) is a timing chart showing an output waveform of the comparator 37 in FIG. 1;

FIG. 5(C) is a timing chart showing a drive frequency of the piezoelectric transformer 1 in FIG. 1;

FIG. 5(D) is a timing chart showing the alternating current IO;

FIGS. 6(A) to 6(C) are timing charts showing output waveforms of a triangular wave oscillation circuit 42 in FIG. 1;

FIG. 6(D) is a timing chart showing an output waveform of a comparator 36 in FIG. 1;

FIG. 7(A) is a timing chart showing an output waveform of a triangular wave oscillation circuit 34 in FIG. 1;

FIG. 7(B) is a timing chart showing an output waveform of a comparator 37 in FIG. 1;

FIG. 7(C) is a timing chart showing an output waveform of the triangular wave oscillation circuit 42 in FIG. 1;

FIG. 7(D) is a timing chart showing an output waveform of a comparator 36 in FIG. 1;

FIG. 7(E) is a timing chart showing an output waveform of an OR circuit 39 in FIG. 1;

FIG. 10 is an illustration showing operation in various portions in FIG. 2;

FIGS. 14(A) to 14(H) are timing charts showing waveforms in respective portions, wherein FIG. 14(A) shows a triangular wave fVCO and a rectified voltage Vc, FIG. 14(B) shows a gate voltage Vg3 of a transistor Q3, FIGS. 14(C) and 14(D) show gate voltages Vg1 and Vg2 of the transistors Q1 and Q2, FIGS. 14(E) and 14(F) show drain voltages Vd1 and Vd2 of the transistors Q1 and Q2, and FIGS. 14(G) and 14(H) show coil currents iL1 and iL2;

DESCRIPTION OF THE PREFERRED EMBODIMENT

Figure 1:
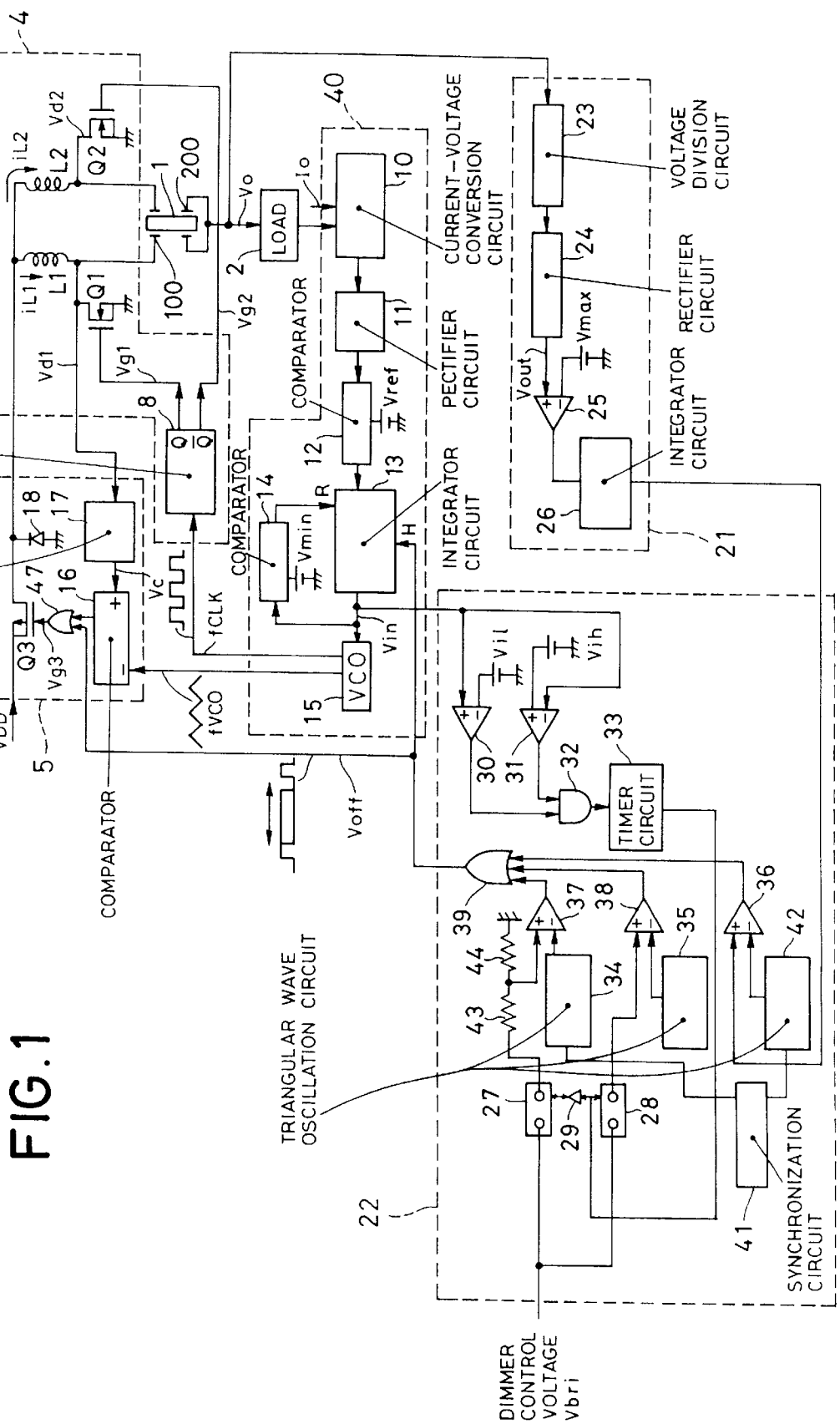
FIG. 1 is a block diagram showing a construction of the first embodiment of a piezoelectric transformer drive circuit according to the present invention.

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instance, wellknown structures are not shown in detail in order to avoid unnecessarily obscure the present invention. It should be noted that like elements to those shown in other drawings would be identified by like reference numerals.

FIG. 1 is a block diagram showing the first embodiment of a piezoelectric transformer drive circuit according to the present invention. In FIG. 1, the like elements to those shown in FIG. 11 will be identified by like reference numerals and detailed description thereof will be neglected in order to keep the disclosure simple enough to facilitate clear understanding of the present invention.

Figure 11:
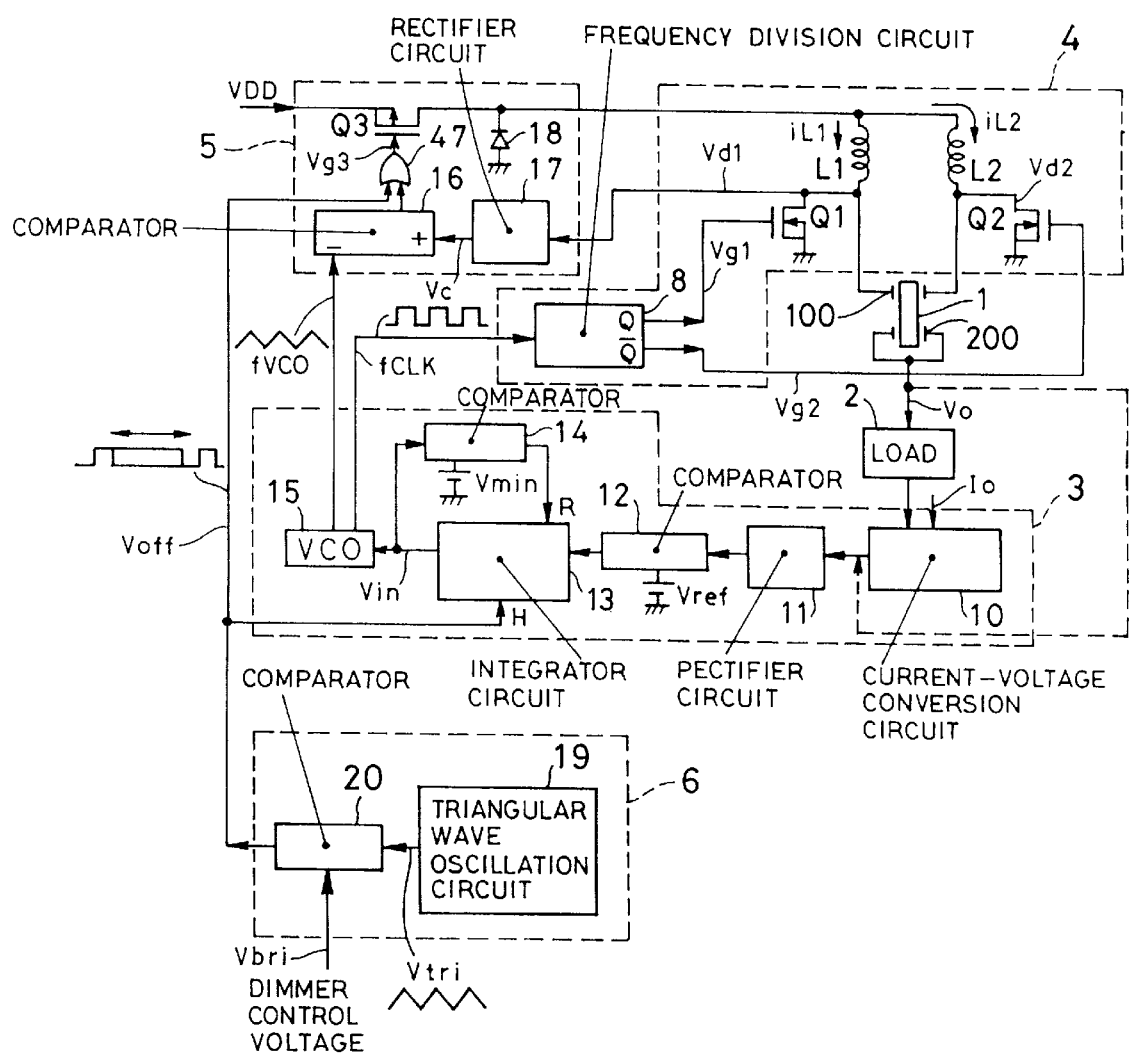
FIG. 11 is a block diagram showing the construction of the conventional piezoelectric transformer drive circuit.
Figure 12A:
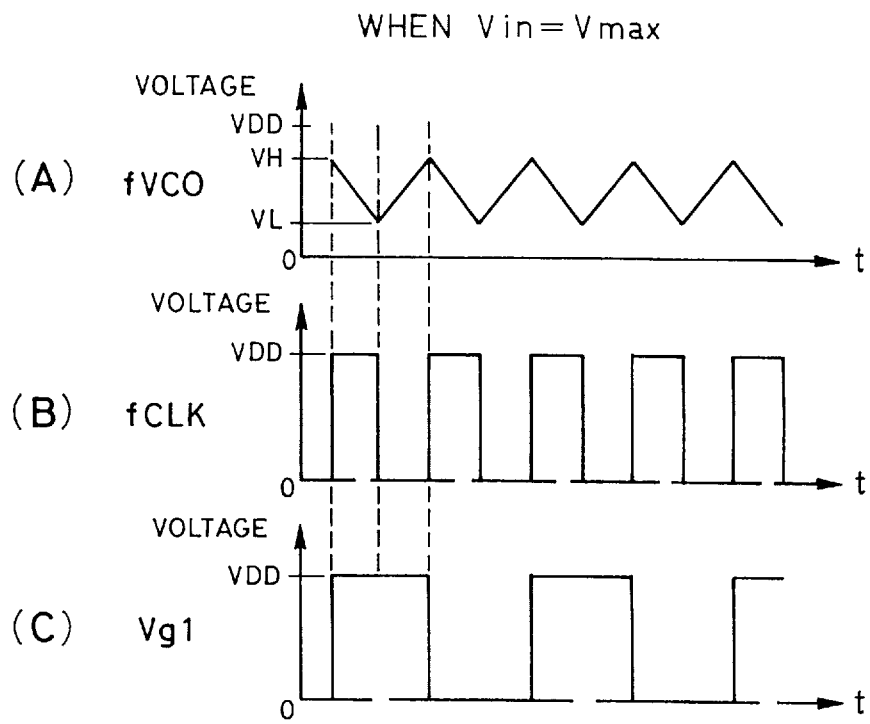
FIGS. 12A and 12B are timing charts showing waveforms of a VCO 15 in FIG. 11, wherein FIGS. 12A(A) to 12A(C) show the case where a voltage Vin from the integrator circuit 13 is the minimum voltage value and FIGS. 12B(D) to 12B(F) show the case where the voltage Vin from the integrator circuit 13 is the maximum voltage.
Figure 12B:
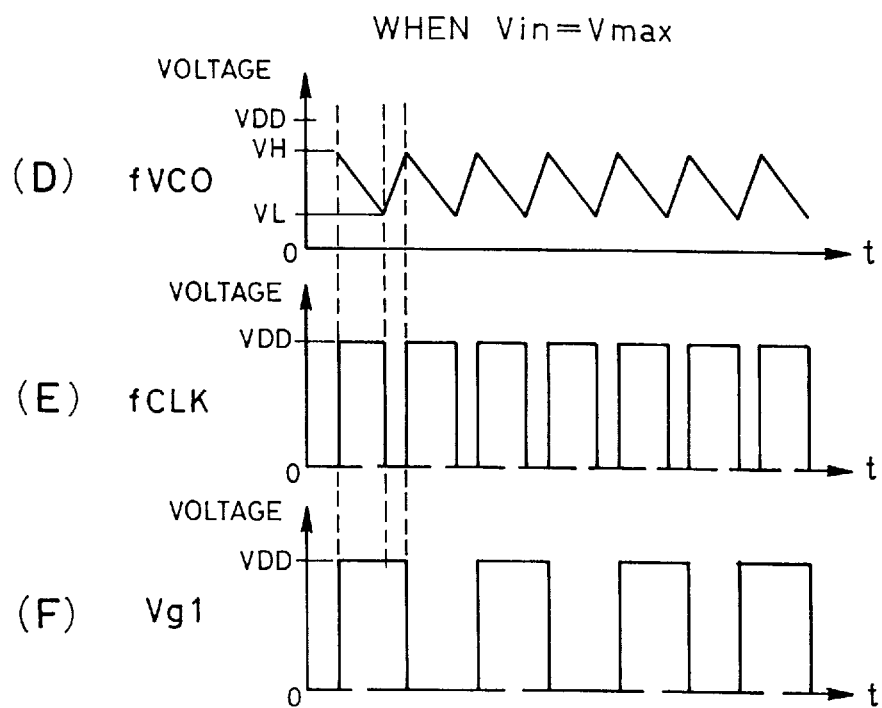

FIG. 1 is a drive circuit. The dimmer circuit 6 in FIG. 11 illustrating the prior art is replaced with a dimmer circuit 22 and an output voltage comparing circuit 21 is added. Other basic operation is the same as those in FIG. 11, as set forth above. The piezoelectric transformer 1 is characterized by high output impedance and dependency of operation on a load impedance.

The drive circuit of FIG. 1 which serves as a piezoelectric transformer inverter is constructed with a piezoelectric transformer 1 outputting an alternating current voltage input from a primary side electrode 100 to a secondary side utilizing a piezoelectric effect, a transformer circuit 4 resonating inductance of the coils L1 and L2 and an input capacitance of the piezoelectric transformer 1 and generating a sine wave for driving the piezoelectric transformer 1 and a load 2 connected to a secondary side electrode 200 of the piezoelectric transformer. The load is a cold cathode tube.

On the other hand, the drive circuit includes a frequency control circuit 40 which takes the alternating current Io flowed through the load 2 as input to output a frequency data for driving the piezoelectric transformer to the transformer circuit 4 and the drive voltage control circuit 5, and in conjunction therewith, to output a frequency control voltage Vin to a dimmer circuit 22. The dimmer circuit 22 is provided for varying brightness of the cold cathode tube.

Furthermore, the drive circuit includes an output voltage comparing circuit 21 outputting a high level to the dimmer circuit 22 by inputting the output voltage Vo of the piezoelectric transformer connected to the secondary side electrode 200 of the piezoelectric transformer 1, and the dimmer circuit 22 inputting the signal from the output voltage comparing circuit 21 and the frequency control circuit 40, and in conjunction therewith, externally inputting a dimmer control voltage Vbri for outputting a drive OFF signal of the piezoelectric transformer 1 to the drive voltage control circuit 5, and in conjunction therewith, for outputting a frequency sweep stopping signal to the frequency control circuit 40.

At first, general discussion will be given for operations of the dimmer circuit 22 and the output voltage comparing circuit 21 with reference to FIG. 2. A timer circuit 33 is designed to effect high level output only when the alternating current Io is stable at a desired value. When the output of the timer circuit 33 is high level, namely when the alternating current Io is stable at the desired value, the dimmer control voltage Vbri is input to the comparator 38 via a switch 28. Thus, brightness of the cold cathode tube is adjusted at the frequency of the triangular wave oscillation circuit 35. In other case, the dimmer control voltage Vbri is adjusted the light with the frequency of the triangular wave oscillation circuit 34 since the dimmer control voltage Vbri is input to the comparator 37 via the switch 27.

The integrator circuit 26 outputs high level only when the load 2 is not connected. Only when the output of the integrator circuit 26 is high level and namely the load 2 is not connected, dimmer control is performed by the frequency of the triangular wave oscillation circuit 42 by the comparator 36. OR of respective outputs of the comparators 37, 38 and 36 is taken by an OR circuit 39. When the output of the OR circuit is high level, a drive OFF signal of the piezoelectric transformer 1 is generated.

Accordingly, as shown in FIG. 2, when the alternating current Io is stable at the desired value and the cold cathode tube as the load 2 is driven to illuminate, the brightness of the cold cathode tube is adjusted by the triangular wave oscillation circuit 35. After turning ON of the power source for the piezoelectric transformer inverter, dimming is performed by the frequency of the triangular wave oscillation circuit 34 until the cold cathode tube is stably turned ON. Upon no load operation where the load 2 is not connected, dimming is effected by the frequency of the triangular wave oscillation circuit 34 while dimming is also effected by the frequency of the triangular wave oscillation circuit 42. The foregoing is the operation of the shown embodiment of the drive circuit.

The frequency of the triangular wave oscillation circuit 35 is a frequency at while blinking of the cold cathode tube is not visually perceptible if blinking is caused in the cold cathode tube and below which the blinking of the cold cathode tube comes visually perceptible. The frequency of the triangular wave oscillation circuit 34 is higher frequency than that of the triangular wave oscillation circuit 35. The frequency of the triangular wave oscillation circuit 42 is lower than the frequency of the triangular wave oscillation circuit 35.

Next, discussion will be given for detailed operation.

The dimmer circuit 22 is constructed with switches 27 and 28, an inverter 29, a comparator 30, a comparator 31, an AND circuit 32, a timer circuit 33, a triangular wave oscillation circuit 34, a triangular wave oscillation circuit 35, a comparator 36, a comparator 37, a comparator 38, an OR circuit 39, a synchronization circuit 41 and a triangular wave oscillation circuit 42.

Here, discussion will be given for the case where a duty ratio for driving the piezoelectric transformer in response to rising of the dimmer control voltage with reference to FIG. 1.

The control voltage Vin output from the integrator circuit 13 forming the frequency control circuit 40 is input to the comparators 30 and 31. The control voltage Vin is a control voltage for the voltage controlled oscillator (hereinafter referred to as VCO) 15 to make judgment of the drive frequency by the voltage value. Particularly, the value of the control voltage Vin and the fluctuation range where the alternating current Io flowing through the load 2 becomes the desired value, are preliminarily checked. Then, the lower limit value Vil of the fluctuation range of the control voltage Vin is input to an inverting input terminal of the comparator 30 and an upper limit value Vih of the fluctuation range is input to a non-inverting input terminal of the comparator 31. By this, when the drive frequency is close to the frequency where the alternating current Io becomes the desired value, both of the comparators 30 and 31 output high level. At this time, the output of the AND circuit 32, to which the outputs of the comparators 30 and 31 are input, becomes high level. On the other hand, when the drive frequency is not the frequency close to the frequency where the alternating current Io is the desired value (in case where the fluctuation is out the fluctuation range), the output of the AND circuit 32 becomes low level.

The output of the AND circuit 32 is input to the timer circuit 33. The timer circuit 33 is so designed as to conduct the input terminal and the output terminal when the high level input is maintained for a predetermined period. Manner of setting of the predetermined period will be discussed hereinafter.

Figure 13:
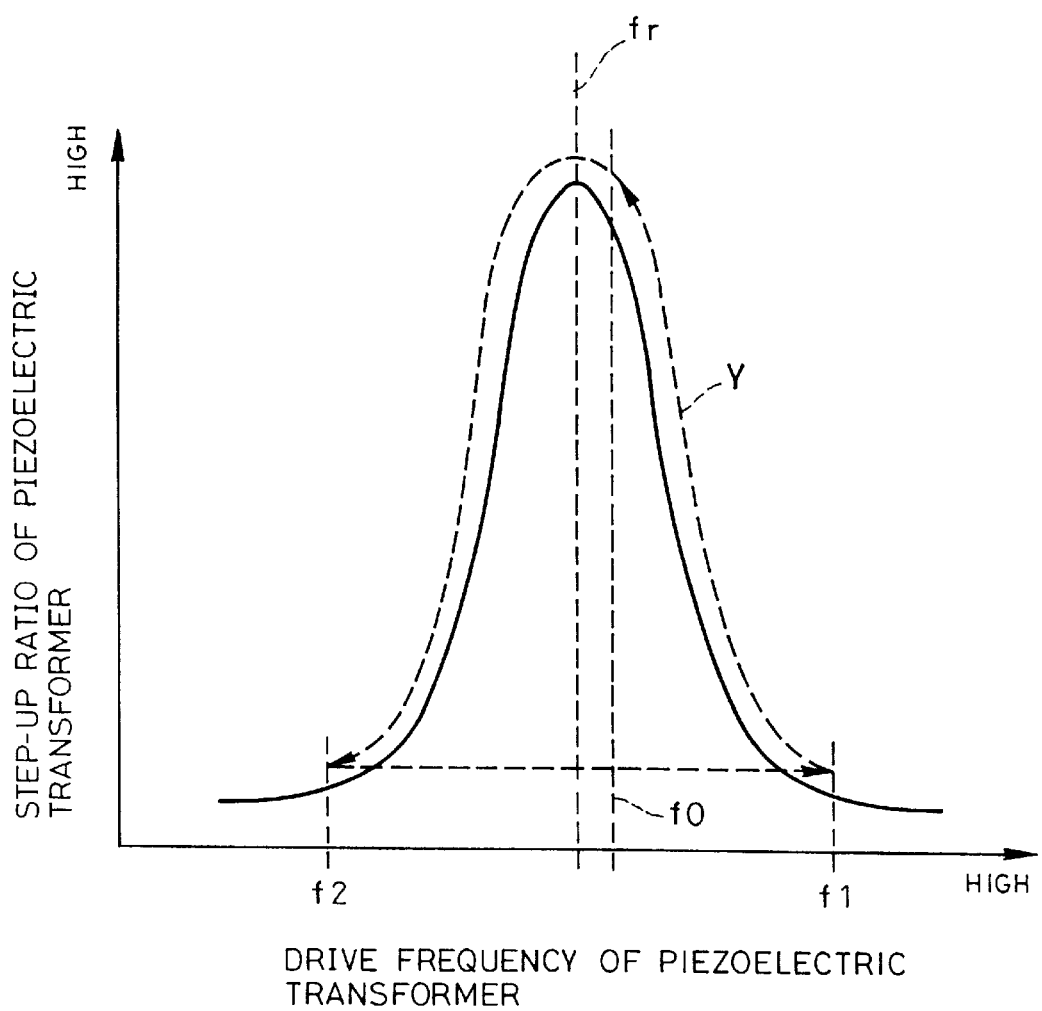
FIG. 13 is an illustration showing a step-up ratio of the piezoelectric transformer and a frequency sweeping direction.
Figure 14A:
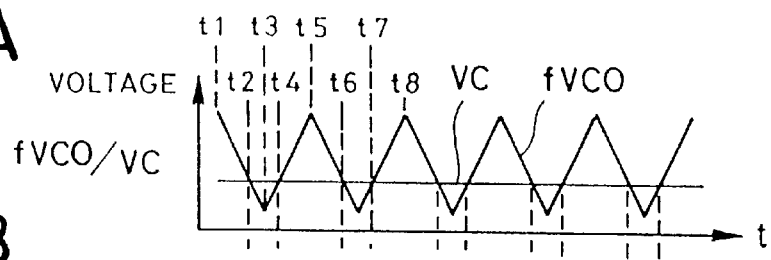
Figure 14B:
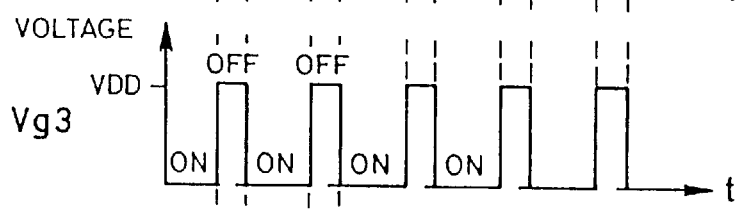
Figure 14C:
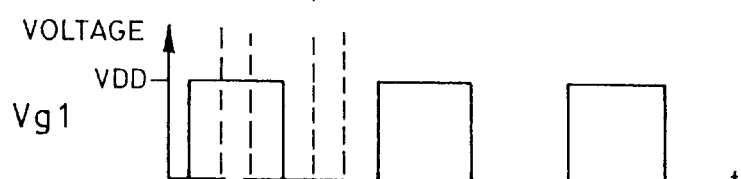
Figure 14D:
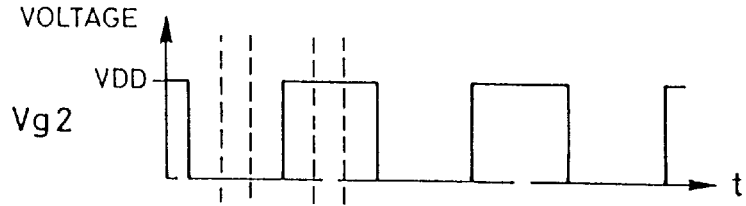
Figure 14E:
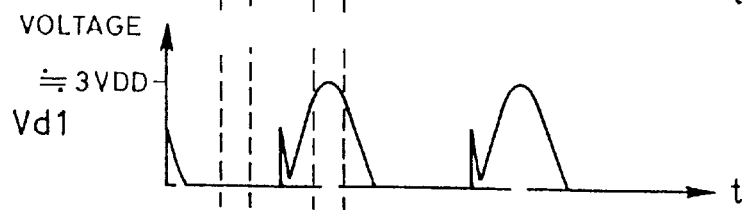
Figure 14F:
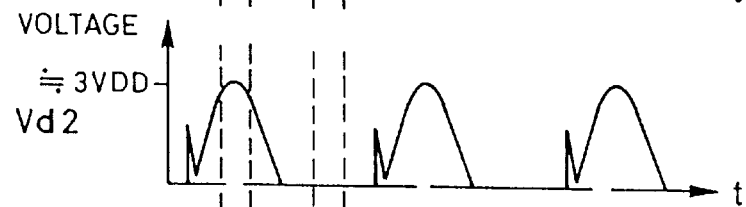
Figure 14G:
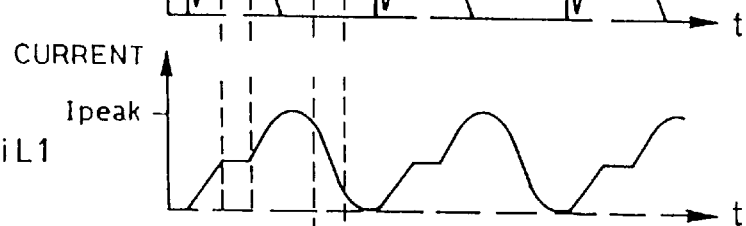
Figure 14H:
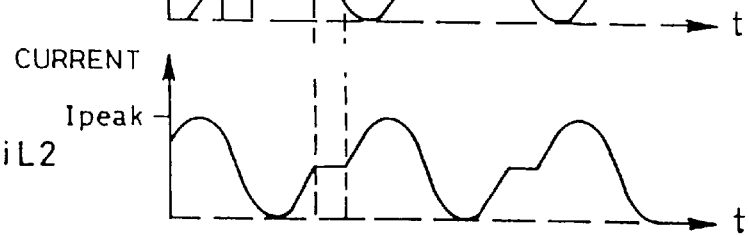

When the input voltage to the piezoelectric transformer inverter is lowered to be lower than the rated value, the input voltage to the piezoelectric transformer becomes insufficient. Then, the output from the piezoelectric transformer also becomes insufficient. Thus, the alternating current Io does not reach the desired value. In this case, the drive frequency of the piezoelectric transformer is swept from the high frequency to the low frequency within a predetermined range. When the drive frequency reaches the lower limit of the predetermined range, the drive frequency is reset to the predetermined upper limit value to initiate sweeping of the drive frequency to the low frequency. At this time, a relationship with the step-up ratio of the piezoelectric transformer 1 is shown in FIG. 13. In the dimming condition, during a drive OFF period of the piezoelectric transformer 1, the frequency immediately before the OFF period is maintained.

Hereinafter, operation will be discussed with reference to FIGS. 3(A) to 3(D). In the condition where the output from the piezoelectric transformer is insufficient, the switch 27 is conducted for the reason set out later and thus the dimmer control voltage is input to the comparator 37. In the comparator 37, in a relationship of inputs shown in FIG. 3(A), the output shown in FIG. 3(B) is generated. The output of the comparator 37 is applied to the gate of the P-channel FET Q3 via the OR circuit 39 and an OR circuit 47. During a period where the output of the comparator 37 is high level, power supply to the piezoelectric transformer 1 is interrupted. The output of the OR circuit 39 is connected to the integrator circuit 13 of the frequency control circuit 40 so that the output of the integrator circuit 13 will never fluctuate during a period where the OR circuit 39 outputs high level. The reason why such operation is taken place, has already been discussed in connection with the prior art.

Output of the integration circuit 13 acts as illustrated in FIG. 3(C). The output of the integrator circuit 13 serves as the control voltage of the VCO 15. When the control voltage is increased, the oscillation frequency is lowered. Accordingly, the drive frequency of the piezoelectric transformer 1 is varied as shown in FIG. 3(D).

Since the output of the AND circuit 32 becomes high level when the output of the integrator circuit 13 shown in FIG. 3(C) falls between Vih and Vil, the high level is output at a timing shown in FIG. 3(E). However, under the condition where the drive frequency is swept, the timer 33 is set so as not to output high level.

Namely, the timer circuit 33 is set so that, during as period, in which the control voltage Vin is varied from the voltage Vil across the voltage Vih, namely approximately in a period shown by T2 in FIGS. 3C and 3E, the timer circuit 33 maintains low level output and initiates high level output only when the high level input is maintained for a period longer than T2. The reason of such setting is to make control system unstable for unnecessarily frequent switching of the dimmer control frequency when the dimmer control frequency is switched between the case where the output of the timer circuit 33 is high level and the case where the output of the timer circuit 33 is low level and the drive frequency could be swept unless the process set forth above is performed.

When the alternating current Io is stable at the desired value, the control voltage Vin is stable between the voltage Vil and the voltage Vih as shown in FIG. 3(F) even in the dimmer control condition. Also, the drive frequency is stable as shown in FIG. 3(G), and the AND circuit 32 maintains high level output as shown in FIG. 3(H). Thus, the output of the timer circuit 33 is maintained at high level.

The output signal of the timer circuit 33 becomes the control voltage of the switch 28 and the switch 27 via an inverter 29. Inputs and outputs of the switches 27 and 28 are conducted when the control voltage becomes high level signal and are opened (blocked) when the control voltage becomes low level. When the output signal of the timer 33 is high level, the dimmer control voltage is input to the non-inverting input terminal of the comparator 38. On the other hand, when the output of the timer 33 is low level, the dimmer control voltage is input to the non-inverting input terminal of the comparator 37.

When the output of the timer circuit 33 is low level, the switch 27 becomes conductive to permit the dimmer control voltage Vbri to be input to the non-inverting input terminal of the comparator 37 via voltage dividing resistors 43 and 44. The reason why the voltage dividing resistors are inserted will be discussed hereinafter.

Figures 15A, 15B, 15C, 15D, 15E:
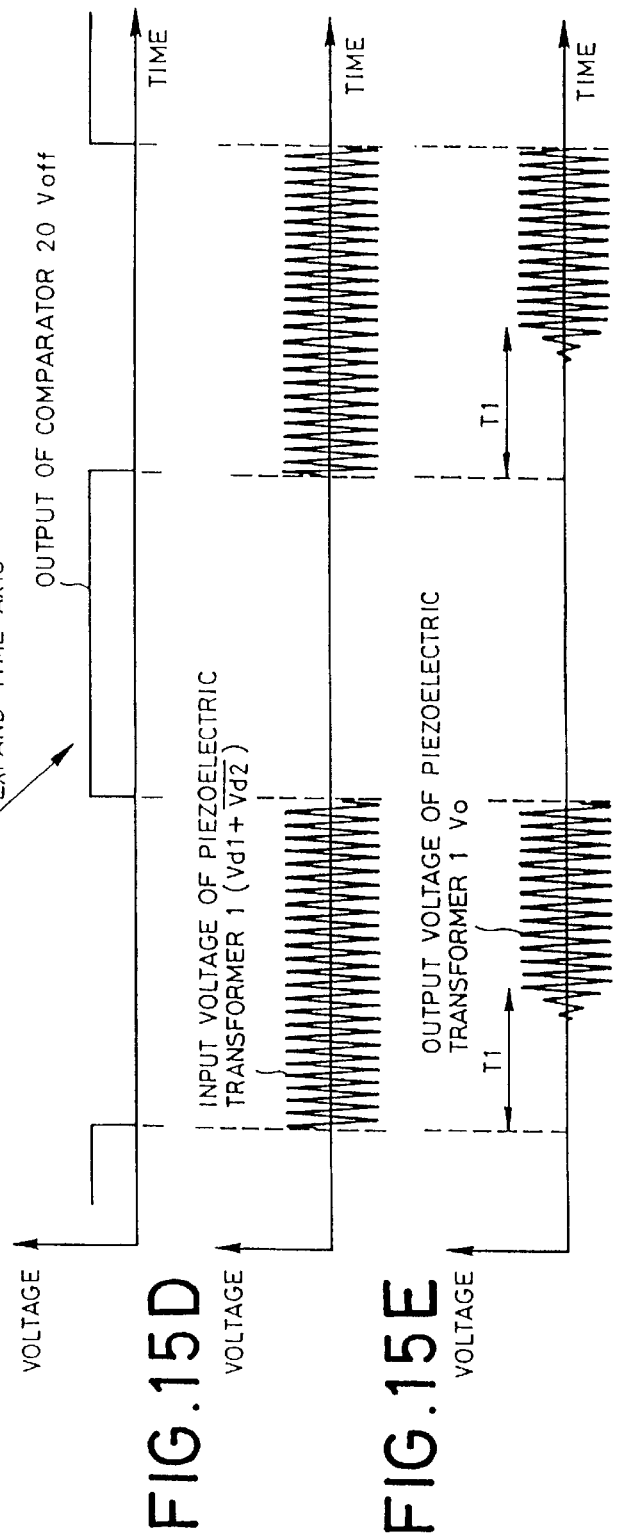
FIG. 15(A) is a timing chart showing an output waveform of a triangular wave oscillation circuit 19 in FIG. 11.
FIG. 15(B) is a timing chart showing an output waveform of a comparator 20 in FIG. 11.
FIG. 15(C) is a timing chart showing an input voltage for a piezoelectric transformer.
FIG. 15(D) is a timing chart showing an input voltage of the piezoelectric transformer.
FIG. 15(E) is a timing chart showing an output voltage of the piezoelectric transformer.
Figure 16A:
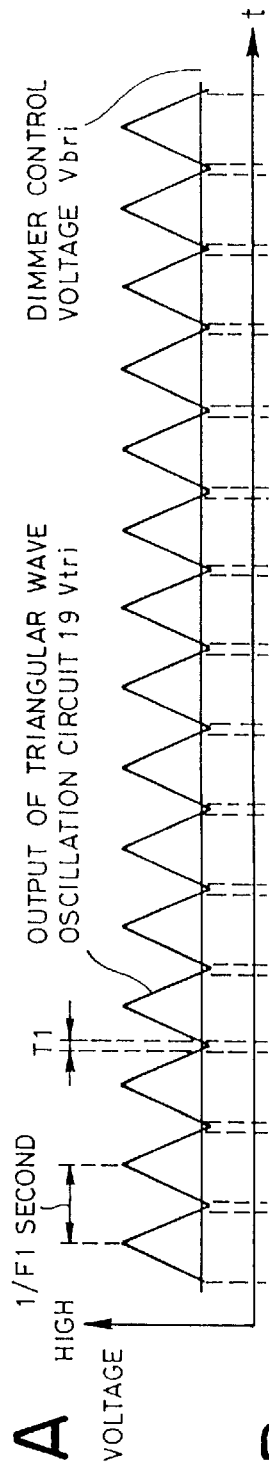
FIG. 16 (A) is a timing chart showing an output waveform of a triangular wave oscillation circuit 19 in FIG. 11.
FIG. 16(B) is a timing chart showing an output waveform of a comparator 20 in FIG. 11.
FIG. 16(C) is a timing chart showing a drive frequency of the piezoelectric transformer 1.
FIG. 16(D) is a timing chart showing an alternating current Io.
Figure 16B:
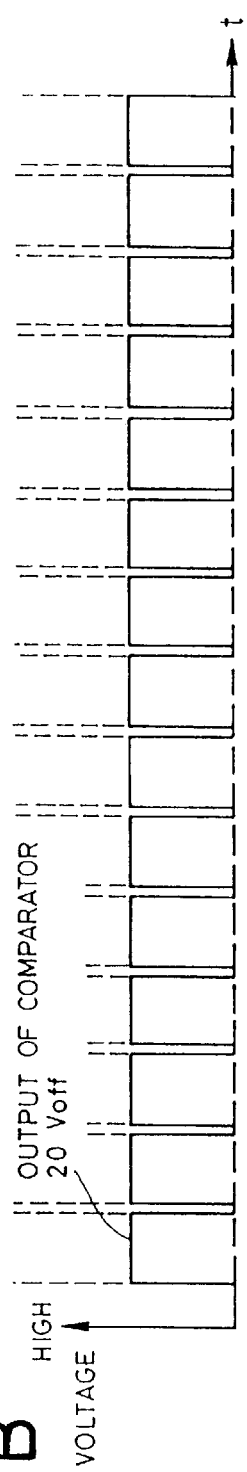
Figure 16C:
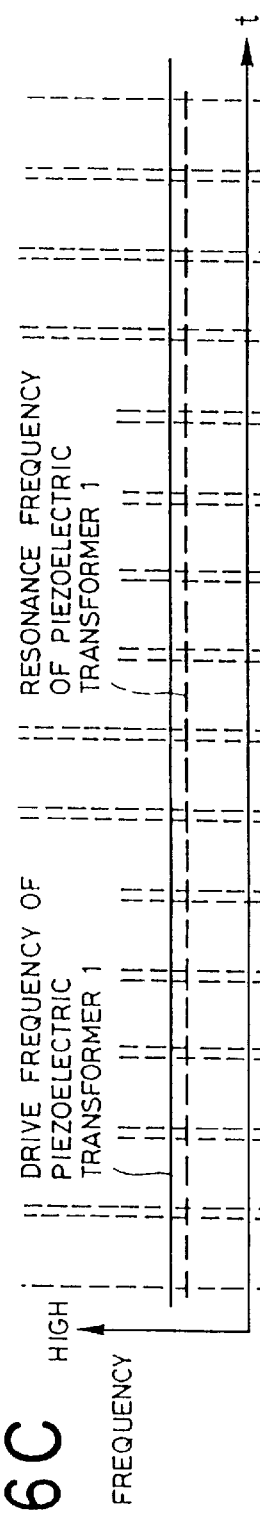
Figure 16D:
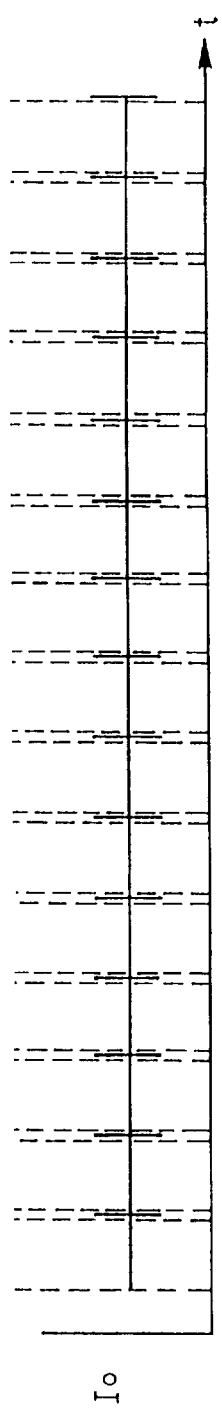
Figure 17A:
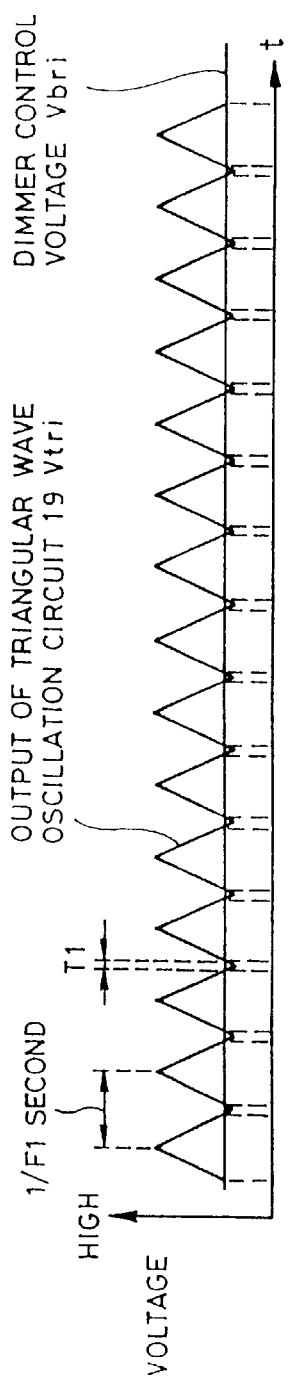
FIG. 17(A) is a timing chart showing an output waveform of a triangular wave oscillation circuit 19 in FIG. 11.
Figure 17B:
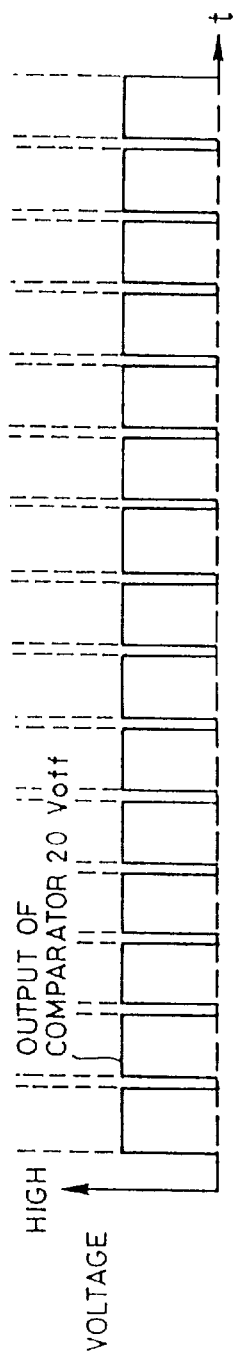
FIG. 17(B) is a timing chart showing an output waveform of a comparator 20 in FIG. 11.
Figure 17C:
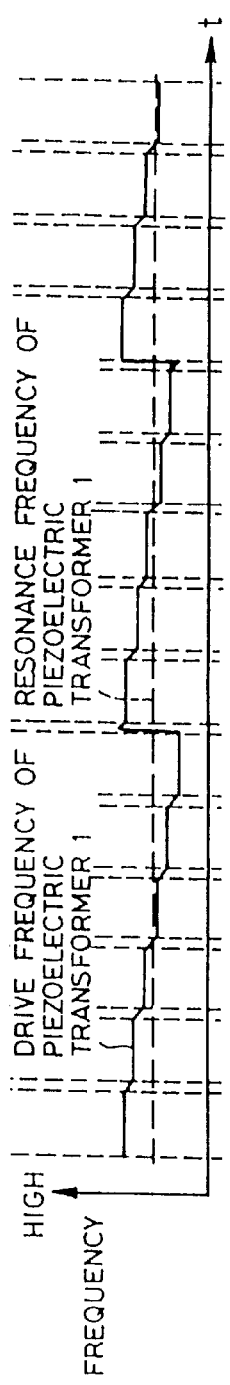
FIG. 17(C) is a timing chart showing a drive frequency of the piezoelectric transformer 1.
Figure 17D:
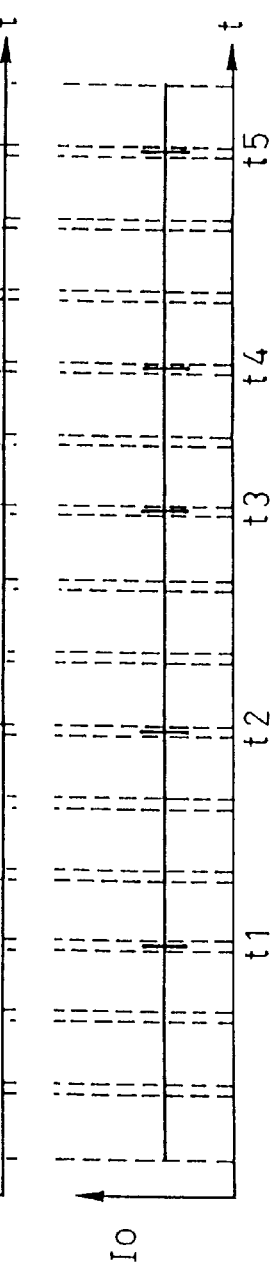
FIG. 17(D) is a timing chart showing an alternating current Io.

As set forth above, drive ON period of the piezoelectric transformer 1 upon dimming causes drawback if it becomes less than T1 as shown in FIG. 15(E). However, in order to certainly provide maximum dimmer control range, the drive ON period should be shortened to be close to T1. Accordingly, when the dimmer control voltage Vbri is fixed at a maximum value V3 within a variation range, the oscillation frequency becomes different as oscillated by the triangular wave oscillation circuit 34 and the triangular wave oscillation circuit 35 in the case where the switch 27 becomes conductive and in the case where the switch 28 becomes conductive. Thus, setting show in FIGS. 4(A) to 4(D) and discussed below becomes necessary. The reason why the oscillation frequencies are different in the triangular wave oscillation circuit 34 and the triangular wave oscillation circuit 35 will be mentioned later. The content shown in FIGS. 4(A) and 4(B) are the case where the dimmer control voltage Vbri is input to the non-inverting input terminal of the comparator 38 via the switch 28. A value of a maximum value V3 among the variation range is set so that the output period of the low level output of the comparator 38 becomes T1 when the maximum value V3 is input. This is because that the period while the output of the comparator 38 is low level is the drive ON period of the piezoelectric transformer 1, and the drive ON period less than T1 should cause drawbacks as set forth above.

Next, discussion will be given for the content shown in FIGS. 4(C) and 4(D). When the dimmer control voltage Vbri is the maximum value V3, and when the dimmer control voltage Vbri is directly input to the non-inverting input terminal of the comparator 37 via the switch 27, the output period of the low level output of the comparator 37 becomes less than T1, as shown in FIG. 4(C). In this case, since the drive ON period of the piezoelectric transformer 1 becomes less than T1, the problems set forth above should be caused. Therefore, by inputting the maximum value V3 to the non-inverting input terminal of the comparator 37 with voltage division by the resistors 43 and 44, and the values of the resistors 43 and 44 are set so that the output period of the low level of the comparator 37 becomes T1. It should be noted that, in FIG. 4(C), R43 is a resistance value of the resistor 43 and R44 is a resistance value of the resistor 44.

By the setting set forth above, when the duty ratio for driving the piezoelectric transformer 1 is minimum, namely the dimmer control voltage Vbri is V3, the drive period of the piezoelectric transformer 1 becomes T1 either the switch 27 is conductive or the switch 28 is conductive.

The frequency of the triangular wave oscillation circuit 35 connected to the inverting input terminal of the comparator 38 is the frequency F1, at which blinking of the cold cathode tube is not visually perceptible when the cold cathode tube is blinking and below which blinking becomes visually perceptible.

When the input voltage to the piezoelectric transformer inverter becomes less than the rated value, the alternating current Io does not becomes the desired value to repeat sweeping of the drive frequency. In case of dimmer control condition in a relationship of the voltage shown in FIGS. 5(A) and 5(B), during the drive ON period of the piezoelectric transformer 1, sweeping of the frequency is stopped and drive frequency sweeping is performed as shown in FIG. 5(C). At this time, at t1 to t5 in FIG. 5(D), only in the cycle passing in the vicinity of the resonance frequency, the alternating current Io flows slightly to slightly turn ON the cold cathode tube. However, the triangular wave oscillation circuit 34 is set at sufficiently high frequency so that blinking is not visually perceptible even if the dimmer control voltage Vbri is V3.

To the non-inverting input terminal of the comparator 36, the output of the integrator circuit 26 of an output voltage comparing circuit 21 which will be discussed later, is input. The output of the integrator circuit 26 is constructed at high level at no load operation when the load 2 of the piezoelectric transformer inverter is not connected in some reason. To the inverting input terminal of the comparator 36, the output of the triangular wave oscillation circuit 42 is connected.

The output frequency of the triangular wave oscillation circuit 42 becomes the frequency further lower than the frequency F1 of the triangular wave oscillation circuit 35. As shown in FIG. 6(A), the output value of the low level of the integrator circuit 26 is set to be lower than a minimum potential VL of the triangular wave as the output of the triangular wave oscillation circuit 42. As shown in FIG. 6(B), upon outputting of the low level of the integrator circuit 26, the output of the comparator 36 is maintained at low level. As shown in FIG. 6(C), the high level value of the output of the integrator circuit 26 is set to be higher than the minimum potential VL of the triangular wave and to be lower than the maximum potential VH of the triangular wave as the output of the triangular wave oscillation circuit 42. As shown in FIG. 6(D), upon outputting of the high level of the integrator circuit 26, the output of the comparator 36 has the duty ratio determined by the output voltage value of the integrator circuit 26.

The output frequency of the triangular wave oscillation circuit 34 is set integer multiple of the output frequency of the triangular wave oscillation circuit 42. As shown at timings of T3 and T4 in FIGS. 7(A) and 7(C), for example, it is preferred to add a synchronization circuit 41 adapting synchronization of initiation of oscillation upon turning ON of the piezoelectric transformer inverter to oscillate the output of the triangular wave oscillation circuit 34 at a timing to be the minimum potential V1 when the output of the triangular wave oscillation circuit 42 becomes the minimum voltage V2.

The OR circuit 39 outputs OR with taking outputs of the comparators 37, 38 and 36, and outputs the OR output to the drive voltage control circuit 5 as the drive OFF signal of the piezoelectric transformer 1 and to the frequency control circuit 40 as the drive frequency sweeping stop signal.

When the load 2 of the piezoelectric transformer 1 becomes open (hereinafter referred to no-load operation), the alternating current IO does not fed back. Therefore, the drive frequency is continuously swept. Thus, the output of the timer circuit 33 is held low level to keep the switch 27 ON so that the comparator performs high level output in time division. At the same time, since the output of the integrator circuit 26 is high level, the output of the comparator 36 is held high level in time division.

Accordingly, in the dimmer control condition, the input as shown in FIG. 7(A) is applied to the comparator 37. The output of the comparator 37 is a signal having the frequency corresponding to the oscillation frequency of the triangular wave oscillation circuit 34 as shown in FIG. 7(B). At the same time, to the comparator 36, the input shown in FIG. 7(C) is applied. The output of the comparator 36 is a signal having the frequency corresponding to the oscillation frequency of the triangular wave oscillation circuit 42 as shown in FIG. 7(D). The output of the OR circuit 39, to which the output of the comparator 37 shown in FIG. 7(B) and the output of the comparator 36 shown in FIG. 7(D) are input, becomes OR of a time division signal at respective frequencies as shown in FIG. 7(E). Accordingly, in case of the no load operation, reduction ratio of the drive duty ratio can be adjusted by setting of a constant of the output voltage value of the integrator circuit 26.

As set forth above, the operation of the dimmer circuit is performed for adjusting the light by the light adjusting frequency of the triangular wave oscillation circuit 35 when the alternating current Io is maintained at the desired value. Under the condition where the drive frequency is swept due to lack of output, dimming is performed by the dimmer control frequency of the triangular wave oscillation circuit 34. During no load operation of the piezoelectric transformer inverter, dimming is performed by two different frequencies of the triangular wave oscillation circuits 34 and 42, namely, by OR of the outputs of the comparators 37 and 36, the drive OFF signal is output. The output voltage comparing circuit 21 is constructed with the voltage dividing circuit 23, the rectifier circuit 24, the comparator 25 and the integration circuit 26. The output voltage of the piezoelectric transformer 1 becomes the input voltage. The input voltage is then divided by the voltage divider circuit 23 and rectified by the rectifier circuit 24 to be input to the comparator 25 as the voltage Vout.

Figure 8:
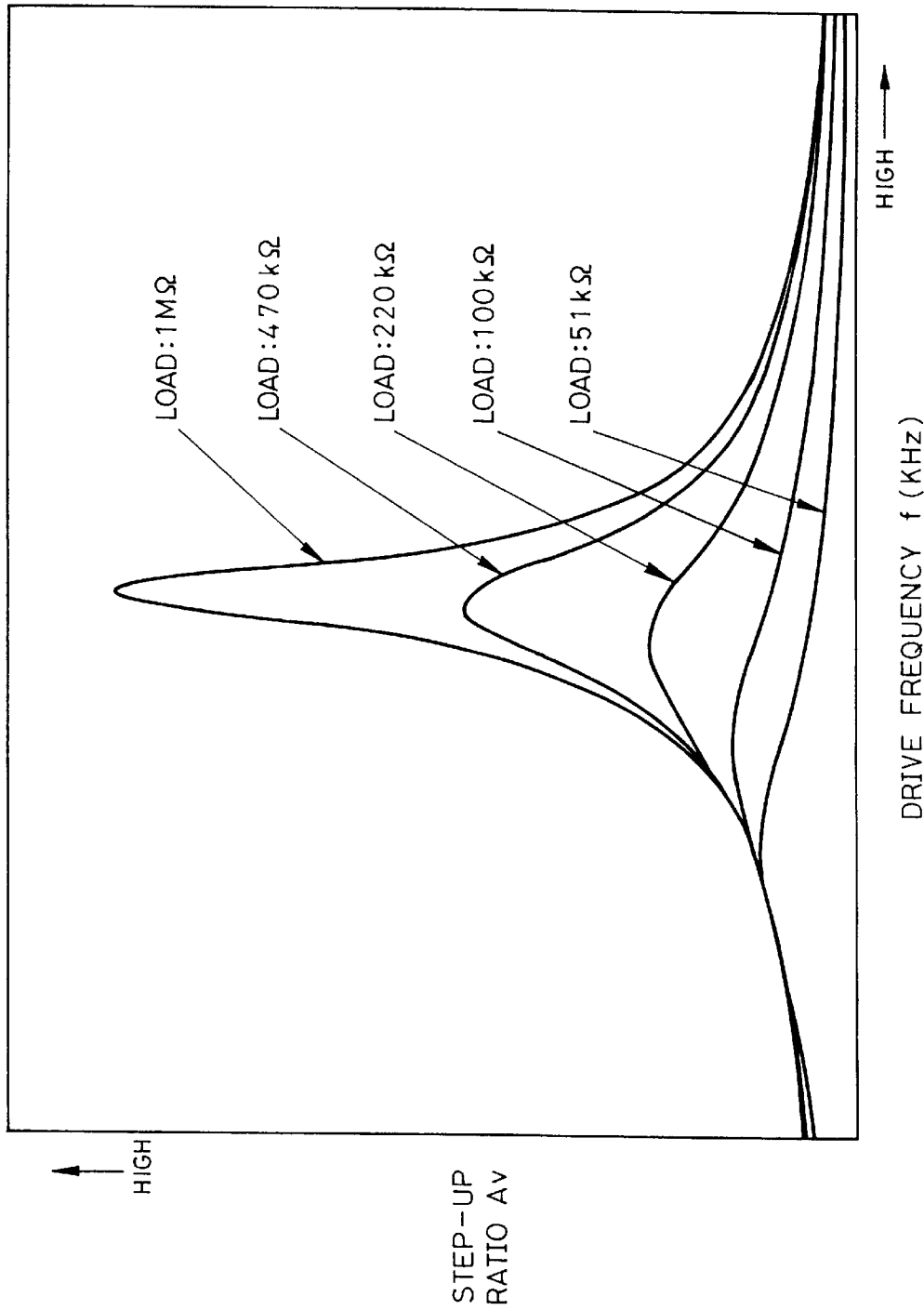
FIG. 8 is an illustration showing a step-up ratio relative to a drive frequency in case of various load impedance.

The piezoelectric transformer has high load dependency and has higher step-up ratio at higher load impedance as one example shown in FIG. 8. Namely, in FIG. 8, there are shown step-up ratio relative to the drive frequency at respective load impedance of 1 MΩ, 470 kΩ, 220 kΩ, 100 kΩ, 51 kΩ. As can be seen from FIG. 8, higher step-up ratio is achieved by higher the load impedance.

On the other hand, the cold cathode tube has a characteristics to have quite high impedance when the alternating current Io does not flow and to abruptly lower the impedance when the alternating current Io flows. From both of these characteristics, when the piezoelectric transformer inverter is in operation at no load and so forth, equivalent load impedance becomes quite high and the output voltage also becomes quite high. Accordingly, the output Vout of the rectifier 24 is low voltage at turning ON of the load, and becomes much larger value at no load operation than that upon turning ON of the load. Vmax to be input to the inverting input terminal of the comparator 25 is set at greater value than Vout at turning ON of the load and at smaller value than Vout at no load operation. Thus, the comparator 25 outputs high level upon no load operation.

The time constant of the integrator circuit 26 to which the output of the comparator 25 is input has to satisfy both of the following two conditions. First condition is consideration concerning the period before initiation of turning ON of the cold cathode tube after turning ON the power supply to the piezoelectric transformer inverter. During a period up to turning ON the cold cathode tube after turning ON the power supply to the piezoelectric transformer inverter, the cold cathode tube has high impedance. Accordingly, during this period, the piezoelectric transformer outputs high voltage. The time constant of the integrator circuit 26 is set at the time constant sufficiently large so that the output thereof is held lower than the voltage value of the triangular wave oscillation circuit 35 during this period. Before initiation of turning ON of the cold cathode tube, the alternating current Io is not stable at the desired value and thus the output of the timer circuit 33 is held low level. Accordingly, during a period after turning ON power supply to the piezoelectric transformer inverter and before initiation of turning ON of the cold cathode tube, dimmer control is performed by high frequency of the triangular wave oscillation circuit 34. The reason of such operation is that when delay of discharging of the cold cathode tube is caused upon initiation of turning ON of the cold cathode tube, it is possible to stabilize the alternating current Io at the desired value after repeating drive frequency sweeping for a several times. In the dimmer control condition, during a period to make the alternating current Io stable at the desired value, the cold cathode tube is slightly illuminated as shown in FIG. 5(D) only when the piezoelectric transformer 1 is driven in the vicinity of the resonance frequency of the piezoelectric transformer 1 shown in FIG. 5(C). Even in this case, in order to make blinking of the cold cathode tube not perceptible, high dimmer control frequency becomes necessary.

Second condition is consideration to maintain high level output of the integrator circuit 26 during a period of drive OFF upon no load operation or a period of the drive frequency at low step-up ratio. Since the alternating current Io is not fed back during no load operation, the drive frequency repeats sweeping. In this case, in the vicinity of resonance frequency, at which step-up ratio is high, the output of the comparator 25 becomes high level, whereas at the frequency far distant from the resonance frequency, the step-up ratio becomes low level. Furthermore, as shown in FIG. 5(C), when the sweep stop period is long for small drive duty ratio, since there is no output of the piezoelectric transformer 1 resulting in low level output of the comparator 25 during the drive OFF period of the piezoelectric transformer 1, a low level period becomes long for small drive duty ratio. However, even in such case, because of no load operation, dimmer control is performed by the frequency of the triangular wave oscillation circuit 42 to make it necessary to maintain a condition where the drive duty ratio is small. Once the output of the comparator 25 becomes high level as shown by the output of the integrator circuit 26 of FIG. 7(C), long time constant is set to maintain the output of the integrator circuit 26 at high level even at the minimum drive duty ratio.

As set forth above, the output voltage comparing circuit 21 performs operation to output the dimmer circuit 22 so that the comparator 36 outputs low level during a period necessary for turning ON the cold cathode tube after turning ON of power supply for the piezoelectric transformer inverter, and to output low level while the cold cathode tube is turned ON or when the drive frequency is swept due to lacking of output of the piezoelectric transformer 1 and high level during no load operation.

While the foregoing is discussion for the case where the drive duty ratio of the piezoelectric transformer 1 small when the dimmer control voltage is high, it can be easily realized even for the case where the drive duty ratio of the piezoelectric transformer 1 is small when the dimmer control voltage is high, by reversing a part of logic.

By providing a plurality of dimmer control frequencies and detecting condition of load, on the basis of the result of detection, an optimal dimmer control frequency is selected or a plurality of dimmer control frequencies are selected and combined to drive the piezoelectric transformer 1 to simultaneously solve various problems which could not be solved simultaneously by the prior art set out below.

The first effect is that the maximum dimmer control range can be realized since the load 2 can be driven at the possible minimum duty ratio not causing problem in practical use when the load is turned ON by the alternating current Io at the desired value. The reason is that the possible minimum duty ratio not causing problem in practical use is driving of the load with ON period T1 at the dimmer control frequency F1. The shown embodiment realizes this. It should be noted that F1 is the dimmer control frequency at which blinking of the cold cathode tube is not visually perceptible but below which the blinking becomes visually perceptible, and T1 is a period where the alternating current Io would not become unstable but less than which the alternating current Io becomes unstable. The reason why the alternating current Io becomes unstable when the ON period is shorter than T1 is as set forth above.

The second effect is that blinking of the cold cathode tube is not visually perceptible when sweeping of the drive frequency is continued for lack of output of the piezoelectric transformer 1 for excessively small input voltage of the piezoelectric transformer inverter or occurrence of delay of discharge of the cold cathode tube. If such situation, blinking of the cold cathode tube should be visually perceptible at the dimmer control frequency F1 as set for thin in the first effect. However, according to the present invention, the dimmer control frequency is switched to be higher in such situation to keep blinking of the cold cathode tube not visually perceptible.

The third effect is that heating of parts of the drive circuit during no load operation can be restricted.

In case of the conventional system set forth above, significant heating of the part is caused. However, in the drive method according to the present invention, in addition to dimmer control by the normal dimmer control frequency, dimmer control is performed at arbitrary ratio at lower frequency, driving of the piezoelectric transformer 1 is turned OFF by OR of two drive OFF signals. Accordingly, upon no load operation, the drive duty ratio of the piezoelectric transformer 1 is lowered effective value of the current flowing through the drive circuit to significantly suppress heating of the parts.

As set forth above, by providing a plurality of dimmer control frequencies and detecting condition of load, on the basis of the result of detection, an optimal dimmer control frequency is selected or a plurality of dimmer control frequencies are selected and combined to drive the piezoelectric transformer 1 to simultaneously solve various problems which could not be solved simultaneously by the prior art set out below.

Figure 9:
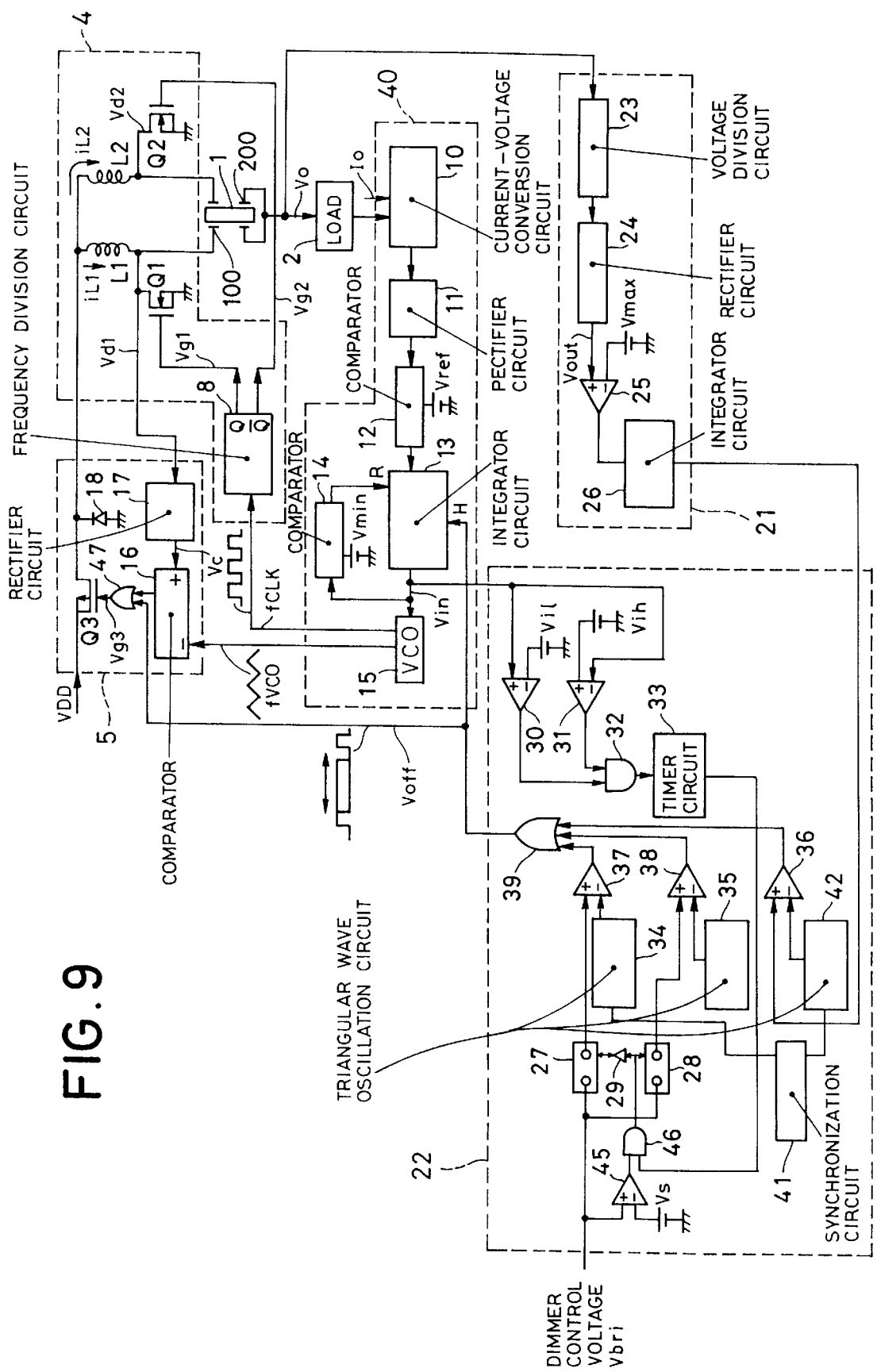
FIG. 9 is a block diagram showing a construction of the second embodiment of the piezoelectric transformer drive circuit according to the present invention.

FIG. 9 shows the second embodiment of the drive circuit of the piezoelectric transformer according to the present invention. Similarly to the first embodiment, the second embodiment is the circuit for the case where the drive duty ratio of the piezoelectric transformer 1 becomes smaller at higher dimmer control voltage. By reversing a part of the logic, the drive circuit which makes the drive duty ratio greater at higher dimmer control voltage, can also be established. Difference of the second embodiment from the first embodiment shown in FIG. 1, is that a control voltage applying circuit for the switches 27 and 28 is provided. Therefore, a comparator 45, a reference voltage Vs for the comparator 45 and an AND circuit 46 are added and resistors 43 and 44 are omitted.

Operations of respective parts in FIG. 9 is shown in FIG. 10. On the basis of this, the control voltage applying circuit of the switches 27 and 28 will be discussed hereinafter with reference to FIG. 10.

The dimmer control voltage is input even to the non-inverting input terminal of the comparator 45. To the inverting input terminal, the reference voltage Vs is input. An output of the comparator 45 is input to the AND circuit 46. To another input terminal of the AND circuit 46, the output of the timer circuit 33 is connected. The output of the timer circuit 33 is input to the switch 28 and the switch 27 via the inverter 29 as a control voltage.

Accordingly, when the alternating current Io is stable at the desired value and if the dimmer control voltage is less than or equal to Vs, namely in a region where the drive duty ratio is large, the piezoelectric transformer 1 is driven by the dimmer control frequency of the triangular wave oscillation circuit 34. In the case where the alternating current Io is stable at the desired value, and if the dimmer control voltage is higher than or equal to Vs, namely in a region where the drive duty ratio is small, the piezoelectric transformer 1 is driven at the dimmer control frequency of the triangular wave oscillation circuit 35 which is lower than the dimmer control frequency of the triangular wave oscillation circuit 34. Vs is a value for switching of the dimmer control frequency. By appropriately selecting this value, higher dimmer control frequency is selected in the case where the drive duty ratio is large, and the lower dimmer control frequency is selected when the drive duty ratio is small. Accordingly, in the first embodiment, the voltage dividing resistors 43 and 44 are inserted for setting the drive ON period of the comparators 37 and 38 at T1 when the dimmer control voltage becomes the maximum value, whereas, in the second embodiment, the resistors 43 and 44 are omitted since such consideration becomes unnecessary. It should be noted that when the alternating current Io is not stable at the desired value, the output of the timer circuit 33 is held low level and, thus the output of the AND circuit 44 becomes low level.

By the foregoing logic, operations in respective part in respective states are shown in FIG. 10. When the load is stably illuminated with alternating current stable at the desired value, if the drive duty ratio of the piezoelectric transformer 1 is large, dimmer control is performed by the dimmer control frequency of the triangular wave oscillation circuit 34, which is different in operation from the first embodiment. In other condition, the triangular wave oscillation circuits to be selected are the same as those in the first embodiment.

As set forth above, the second embodiment is characterized by switching of the dimmer control frequencies depending upon the drive duty ratio of the piezoelectric transformer 1 when the alternating current Io is stable at the desired value. In other operation, under the condition where the drive frequency is swept, the dimmer control is performed by the dimmer control frequency of the triangular wave oscillation circuit 34, and even before initiation of turning ON of the cold cathode tube, dimmer control is performed by the dimmer control frequency of the triangular wave oscillation circuit 34. Upon no load operation, driving is stopped by OR of the outputs of the comparators 37 and 38 to perform the same operation as the first embodiment. Accordingly, the same effect as the first embodiment can be achieved.

On the other hand, while not illustration as the circuit block diagram, by monitoring the outputs of the integrator circuit 26, the timer circuit 33 and the AND circuit 46, the same signal as the output signal of the OR circuit 39 can be output by the microcomputer.

Inherent matters in either embodiments set forth above are to detect the load condition or dimmer control signal, to select the optimum dimmer control frequency or select and combine a plurality of dimmer control frequencies for driving the piezoelectric transformer 1.

As set forth above, the present invention is effective for realizing the maximum dimmer control range by driving by the possible minimum duty ratio not causing problem in practical use. Also, by switching the dimmer control frequency at higher frequency, blinking of the load or the cold cathode tube cannot be visually perceptible. Therefore, when sweeping of the drive frequency is continued due to lack of output of the piezoelectric transformer or occurrence of delay of discharge of the cold cathode tube, blinking of the cold cathode tube may not be visually perceptible. Furthermore, in no load operation, in addition to dimmer control at the normal dimmer control frequency, dimmer control is effected by lower frequency at arbitrary ratio and turning OFF driving of the piezoelectric transformer by OR of two drive OFF signal, the drive duty ratio during no load operation can be lowered the effective value of the current flowing through the drive circuit to suppress heating of the parts.

Although the present invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the feature set out in the appended claims.

What is claimed is:

1. A piezoelectric transformer drive circuit performing driving of a piezoelectric transformer in time division, comprising:

generating means for generating a plurality of kinds of time division frequency signals to be used in said time division driving; and selecting means for selecting a plurality of kinds of the generated time division frequency signals depending upon condition of said piezoelectric transformer, for driving said piezoelectric transformer at the time division frequency output from said selecting means.

2. A piezoelectric transformer drive circuit as set forth in claim 1, wherein said selecting means outputs said plurality of kinds of time division frequency signals in combination.

3. A piezoelectric transformer drive circuit as set forth in claim 1, wherein said generating means generates first and second time division frequency signals having mutually different repetition frequencies, and said selecting means outputs the signal having lower repetition frequency among said first and second time division frequency signals in the state where a feedback current value from a load of said piezoelectric transformer is within a predetermined range, is maintained for a predetermined period.

4. A piezoelectric transformer drive circuit as set forth in claim 1, wherein said generating means generates first and second time division frequency signals having mutually different repetition frequencies, and said selecting means outputs the signal having higher repetition frequency among said first and second time division frequency signals in the state where a feedback current value from a load of said piezoelectric transformer is within a predetermined range, is not maintained for a predetermined period.

5. A piezoelectric transformer drive circuit as set forth in claim 1, wherein said generating means generates first and second time division frequency signals having mutually different repetition frequencies, and said selecting means outputs the signal having higher repetition frequency among said first and second time division frequency signals in the state where a feedback current value from a load of said piezoelectric transformer is out of a predetermined range.

6. A piezoelectric transformer drive circuit as set forth in claim 1, wherein said generating means generates first and second time division frequency signals having mutually different repetition frequencies, and said selecting means outputs the signal having higher repetition frequency among said first and second time division frequency signals in the state where a feedback current value from a load of said piezoelectric transformer is out of a predetermined range, is maintained for a predetermined period and where the output level of said piezoelectric transformer is out of a predetermined range.

7. A piezoelectric transformer drive circuit as set forth in claim 3, wherein the signal having lower repetition frequency among said first and second time division frequency signals has a minimum frequency, at which blinking of a cold cathode tube as a load of said piezoelectric transformer is out of visual perception.

8. A piezoelectric transformer drive circuit as set forth in claim 1, wherein said generating means generates first and second time division frequency signals having mutually different repetition frequencies, and said selecting means selectively outputs said first and second time division frequency signals depending upon feedback current value from a cold cathode tube as load of said piezoelectric transformer and a dimmer control signal to said cold cathode tube.

9. A piezoelectric transformer drive circuit as set forth in claim 8, wherein said selecting means outputs a signal having lower repetition frequency among said first and second time division frequency signals in the case where said feedback current value is continued at the value with a reference range for a predetermined period and said dimmer control signal is a signal requiring a duty ratio to be smaller than a predetermined reference value.

10. A piezoelectric transformer drive circuit as set forth in claim 8, wherein said selecting means outputs a signal having higher repetition frequency among said first and second time division frequency signals in the case where said feedback current value is maintained at a value out of a reference range for a predetermined period.

11. A piezoelectric transformer drive circuit as set forth in claim 8, wherein said selecting means outputs a signal having higher repetition frequency among first and second time division frequency signals in the case where said dimmer control signal is a signal requiring a duty ratio greater than a predetermined reference value.

12. A piezoelectric transformer drive method for performing driving of a piezoelectric transformer in time division, comprising:

generating step of generating a plurality of kinds of time division frequency signals to be used in said time division driving; and selecting step of selecting a plurality of kinds of the generated time division frequency signals depending upon condition of said piezoelectric transformer, for driving said piezoelectric transformer at the time division frequency output from said selecting step.

13. A piezoelectric transformer drive method as set forth in claim 12, wherein in said selecting step, said plurality of kinds of time division frequency signals are output in combination.

14. A piezoelectric transformer drive method as set forth in claim 12, wherein in said generating step, first and second time division frequency signals having mutually different repetition frequencies are generated, and in said selecting step, the signal having lower repetition frequency among said first and second time division frequency signals is output in the state where a feedback current value from a load of said piezoelectric transformer is within a predetermined range, is maintained for a predetermined period.

15. A piezoelectric transformer drive method as set forth in claim 12, wherein in said generating step, first and second time division frequency signals having mutually different repetition frequencies are generated, and in said selecting step, the signal having higher repetition frequency among said first and second time division frequency signals is output in the state where a feedback current value from a load of said piezoelectric transformer is within a predetermined range, is not maintained for a predetermined period.

16. A piezoelectric transformer drive method as set forth in claim 12, wherein in said generating step, first and second time division frequency signals having mutually different repetition frequencies are generated, and in said selecting step, the signal having higher repetition frequency among said first and second time division frequency signals is output in the state where a feedback current value from a load of said piezoelectric transformer is out of a predetermined range.

17. A piezoelectric transformer drive method as set forth in claim 12, wherein in said generating step, first and second time division frequency signals having mutually different repetition frequencies are generated, and in said selecting step, the signal having higher repetition frequency among said first and second time division frequency signals is output in the state where a feedback current value from a load of said piezoelectric transformer is out of a predetermined range, is maintained for a predetermined period and where the output level of said piezoelectric transformer is out of a predetermined range.

18. A piezoelectric transformer drive circuit as set forth in claim 14, wherein the signal having lower repetition frequency among said first and second time division frequency signals has a minimum frequency, at which blinking of a cold cathode tube as a load of said piezoelectric transformer is out of visual perception.

19. A piezoelectric transformer drive method as set forth in claim 12, wherein in said generating step, first and second time division frequency signals having mutually different repetition frequencies are generated, and in said selecting step, said first and second time division frequency signals is selectively output depending upon feedback current value from a cold cathode tube as load of said piezoelectric transformer and a dimmer control signal to said cold cathode tube.

20. A piezoelectric transformer drive method as set forth in claim 19, wherein in said selecting step, a signal having lower repetition frequency among said first and second time division frequency signals is output in the case where said feedback current value is continued at the value with a reference range for a predetermined period and said dimmer control signal is a signal requiring a duty ratio to be smaller than a predetermined reference value.

21. A piezoelectric transformer drive method as set forth in claim 19, wherein in said selecting step, a signal having higher repetition frequency among said first and second time division frequency signals is output in the case where said feedback current value is maintained at a value out of a reference range for a predetermined period.

22. A piezoelectric transformer drive method as set forth in claim 19, wherein in said selecting step, a signal having higher repetition frequency among first and second time division frequency signals is output in the case where said dimmer control signal is a signal requiring a duty ratio greater than a predetermined reference value.

* * * * *